United States Patent
Onodera et al.

(12) 
(10) Patent No.: US 8,003,533 B2
(45) Date of Patent: Aug. 23, 2011

(54) METHOD FOR FORMING A LAMINATED STRUCTURE HAVING A WETTABILITY-VARIABLE LAYER

(75) Inventors: Atsushi Onodera, Tokyo (JP); Hidenori Tomono, Kanagawa (JP); Koei Suzuki, Kanagawa (JP); Takanori Tano, Kanagawa (JP); Takumi Yamaga, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 741 days.

(21) Appl. No.: 11/832,155

(22) Filed: Aug. 1, 2007

(65) Prior Publication Data

US 2008/0029766 A1 Feb. 7, 2008

(30) Foreign Application Priority Data

Aug. 4, 2006 (JP) ................................. 2006-213404
Jul. 11, 2007 (JP) ................................. 2007-182448

(51) Int. Cl.
*H01L 21/44* (2006.01)
*H01L 21/00* (2006.01)
*H01L 21/3205* (2006.01)

(52) U.S. Cl. ........ 438/674; 438/151; 438/585; 438/665; 257/E21.174; 257/E21.159

(58) Field of Classification Search ................... 438/151, 438/149, 585, 586, 66, 674, 665; 257/E21.174, 257/E21.159

See application file for complete search history.

(56) References Cited

U.S. PATENT DOCUMENTS

| | | | |
|---|---|---|---|
| 7,365,008 B2 * | 4/2008 | Hirai et al. | 438/674 |
| 2003/0059987 A1 * | 3/2003 | Sirringhaus et al. | 438/149 |
| 2004/0238816 A1 * | 12/2004 | Tano et al. | 257/40 |
| 2005/0071969 A1 | 4/2005 | Sirringhaus et al. | |
| 2005/0163938 A1 | 7/2005 | Yamazaki et al. | |
| 2008/0315428 A1 * | 12/2008 | Fujii | 257/773 |

FOREIGN PATENT DOCUMENTS

| | | |
|---|---|---|
| EP | 1 282 175 A2 | 2/2003 |
| JP | 2005-12181 | 1/2005 |
| JP | 2005-310962 | 11/2005 |
| JP | 2006-278534 | 10/2006 |
| WO | WO 2004/066477 A2 | 8/2004 |

OTHER PUBLICATIONS

U.S. Appl. No. 12/144,079, filed Jun. 23, 2008, Yamaga, et al.

* cited by examiner

*Primary Examiner* — Shouxiang Hu
(74) *Attorney, Agent, or Firm* — Oblon, Spivak, McClelland, Maier & Neustadt, L.L.P.

(57) ABSTRACT

A disclosed laminated structure includes a wettability-variable layer containing a wettability-variable material whose surface energy changes when energy is applied thereto and including at least a high-surface-energy area having high surface energy and a low-surface-energy area having low surface energy; and a conductive layer formed on the high-surface-energy area. The high-surface-energy area includes a first area and a second area extending from the first area and having a width smaller than that of the first area.

15 Claims, 16 Drawing Sheets

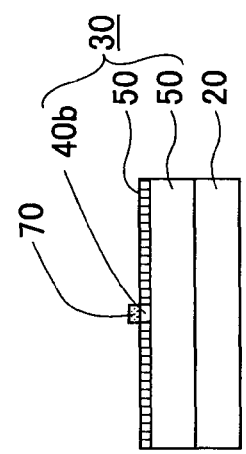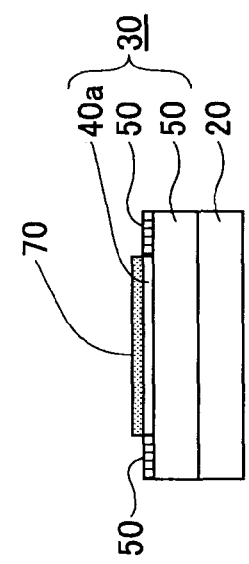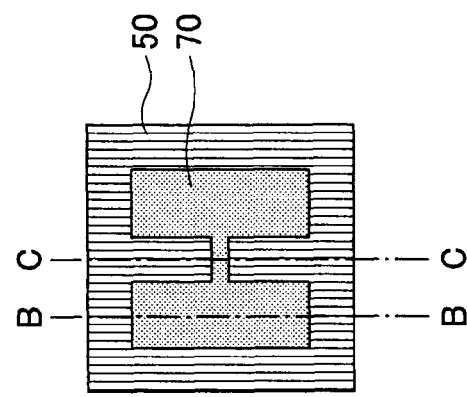

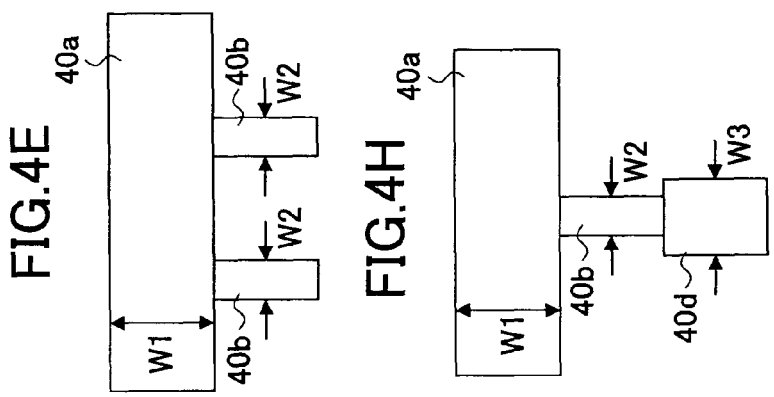
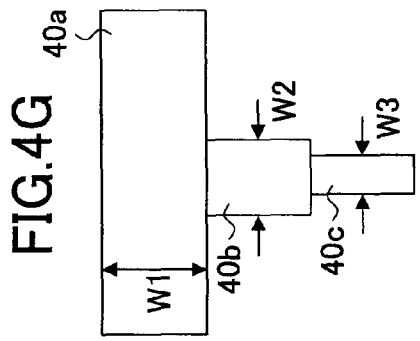
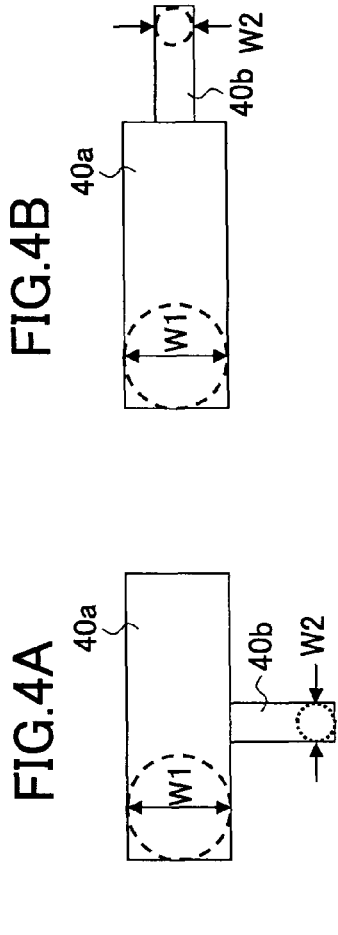
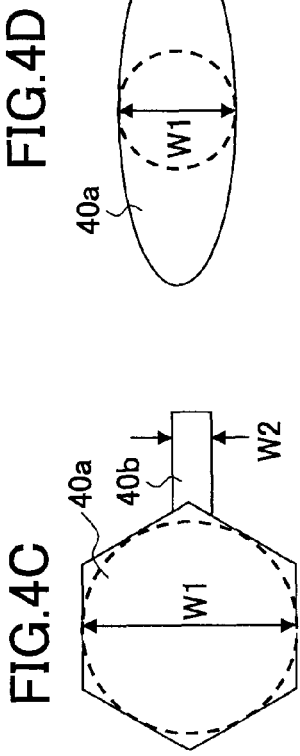
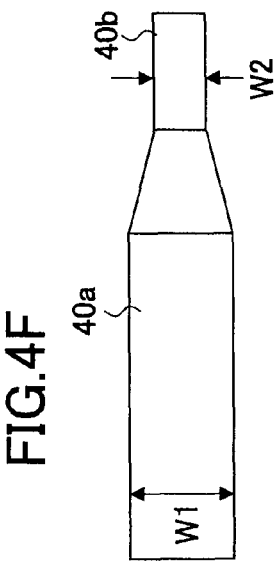

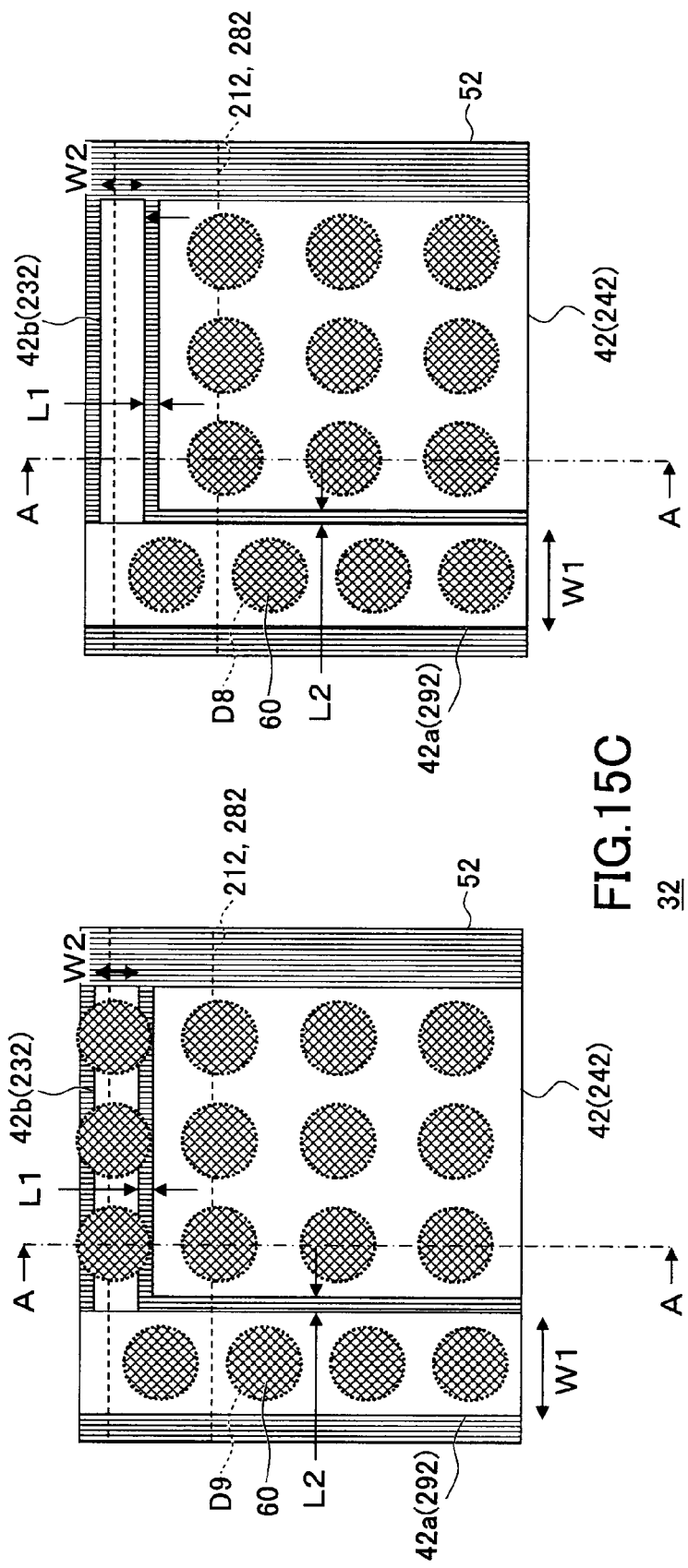
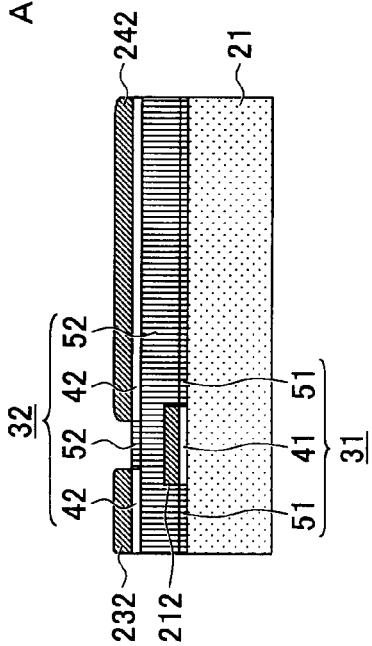
FIG.15A  FIG.15B  FIG.15C

METHOD FOR FORMING A LAMINATED STRUCTURE HAVING A WETTABILITY-VARIABLE LAYER

BACKGROUND OF THE INVENTION

1. Field of the Invention

The present invention generally relates to a laminated structure including functional layers such as a conductive layer and an insulating layer, a method of producing the laminated structure, a multilayer circuit board, an active matrix substrate, and an electronic display.

2. Description of the Related Art

Printing methods are popularly used for forming patterns of functional materials (such as conductive materials, insulators, and semiconductors) that are used, for example, in electronic circuits. In a typical printing method, a pattern is formed by depositing a predetermined amount of a functional fluid containing a functional material on specified areas of a substrate (see, for example, patent documents 1 and 2).

Although photolithography enables formation of very fine functional material patterns, printing methods have advantages over photolithography in terms of equipment costs, the number of pattern forming steps, and material-use efficiency. However, with conventional printing methods, deposited functional fluid tends to spread on the substrate or to agglomerate and form a mass. This problem in turn makes it difficult to form a fine functional material pattern.

Patent documents 1 and 2 disclose a method to solve the above problem. In the disclosed method, a wettability-variable layer containing a wettability-variable material, whose surface energy changes when energy is applied, is formed on a substrate. Next, energy such as ultraviolet light is applied to a portion of the wettability-variable layer. As a result, two areas having different surface energies are formed on the wettability-variable layer. Then, a functional fluid is deposited selectively on one of the two areas (high-surface-energy area) having a surface energy higher than that of the other one of the two areas (low-surface-energy area).

Patent document 3 discloses a method to prevent the spread of a functional fluid on a substrate. In the disclosed method, banks are formed on a substrate and a functional fluid is poured into a groove between the banks.

Also, in this method, before depositing a functional fluid, a high-surface-energy area is formed on the groove between the banks and low-surface-energy areas are formed on the banks. The difference in surface energy enables the functional fluid to smoothly flow into the groove and thereby makes it possible to form a fine and uniform functional material pattern.

[Patent document 1] Japanese Patent Application Publication No. 2005-310962

[Patent document 2] Japanese Patent Application Publication No. 2006-278534

[Patent document 3] Japanese Patent Application Publication No. 2005-12181

FIGS. 1A through 2G are drawings used to describe problems in the above conventional methods for forming functional material patterns.

With the conventional method disclosed in patent documents 1 and 2, as shown in FIG. 1A, if the diameter of a drop of a functional fluid 1 deposited on a high-surface-energy area 2a is larger than the width of the high-surface-energy area 2a, the functional fluid 1 may overflow into a low-surface energy area 2b.

A typical diameter of a functional fluid drop jetted by an inkjet method is several tens of μm or larger. As shown in FIG. 1B, taking into account a positional deviation L of a drop of the functional fluid 1 jetted by a nozzle 3 and the accuracy of positioning by a stage (not shown) holding a wettability-variable layer 2, it is obvious that forming a functional material pattern having a width of less than several tens of μm is difficult with the conventional method disclosed in patent documents 1 and 2.

For example, with the conventional method disclosed in patent documents 1 and 2, it is difficult to form fine conductive patterns (or wiring) constituting transistors of an active matrix substrate. In other words, using the above conventional method for forming transistors of an active matrix substrate may degrade the quality of the transistors and consequently degrade the performance of an electronic display including the active matrix substrate.

As described above, the method disclosed in patent document 3 makes it possible to form a fine and uniform functional material pattern. However, formation of banks for forming a fine groove having a width equal to or smaller than several tens of μm is difficult with a printing method. Therefore, it is necessary to use a photolithography process including many steps to form such fine banks. For example, a photolithography process for forming banks involves the following steps (a) through (g) shown in FIGS. 2A through 2G:

(a) A bank material is applied to the upper surface of a substrate 11 to form a bank layer 12 (bank layer forming step).

(b) A resist material is applied to the upper surface of the bank layer 12 to form a resist layer 13 (resist layer forming step).

(c) A portion of the resist layer 13 is exposed to ultraviolet light 15 through a photomask 14 (exposure step).

(d) The exposed portion of the resist layer 13 is removed by using an alkaline solution (development step).

(e) A portion of the bank layer 12 corresponding to the removed portion of the resist layer 13 is removed by etching (etching step).

(f) Remaining portions 13A of the resist layer 13 are removed and a high-surface-energy area 16 is formed on the exposed surface of the substrate 11 by $O_2$ plasma-treatment (high-surface-energy area forming step).

(g) Then, low-surface energy areas 17 are formed on remaining portions 12A of the bank layer 12 by $CF_4$ plasma-treatment (low-surface-energy area forming step).

SUMMARY OF THE INVENTION

The present invention provides a laminated structure, a method of producing the laminated structure, a multilayer circuit board, an active matrix substrate, and an electronic display that substantially obviate one or more problems caused by the limitations and disadvantages of the related art.

According to an embodiment of the present invention, a laminated structure includes a wettability-variable layer containing a wettability-variable material whose surface energy changes when energy is applied thereto and including at least a high-surface-energy area having high surface energy and a low-surface-energy area having low surface energy; and a conductive layer formed on the high-surface-energy area; wherein the high-surface-energy area includes a first area and a second area extending from the first area and having a width smaller than that of the first area.

Another embodiment of the present invention provides a method of forming a laminated structure that includes a first step of forming a wettability-variable layer containing a wettability-variable material whose surface energy changes when energy is applied thereto; a second step of forming a high-surface-energy area having high surface energy and a low-surface-energy area having low surface energy on the wettability-variable layer by applying energy to a portion of the wettability-variable layer, the high-surface-energy area including a first area and a second area extending from the first area and having a width smaller than that of the first area; a third step of depositing a functional fluid containing a functional material selectively on the first area and allowing the deposited functional fluid to flow into the second area so that the functional fluid covers the entire high-surface-energy area; and a fourth step of forming a functional layer containing the functional material on the high-surface-energy area by evaporating the functional fluid on the high-surface-energy area.

BRIEF DESCRIPTION OF THE DRAWINGS

FIGS. 3A through 3C are drawings illustrating an exemplary laminated structure according to an embodiment of the present invention;

FIGS. 4A through 4H are drawings illustrating examples of a first area 40a and a second area 40b;

FIGS. 15A through 15C are drawings illustrating exemplary methods of forming a source electrode and a source signal line.

DESCRIPTION OF THE PREFERRED EMBODIMENTS

Figure 1A:
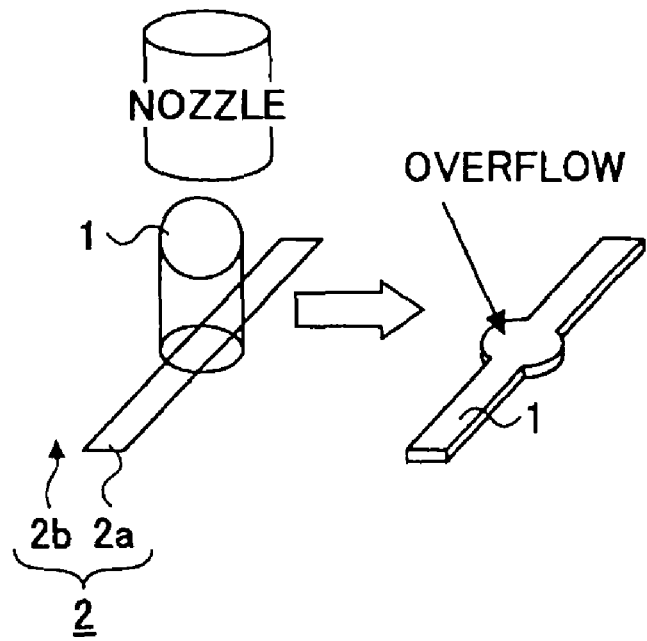
FIGS. 1A and 1B are drawings used to describe problems in a conventional method of forming a functional material pattern.
Figure 1B:
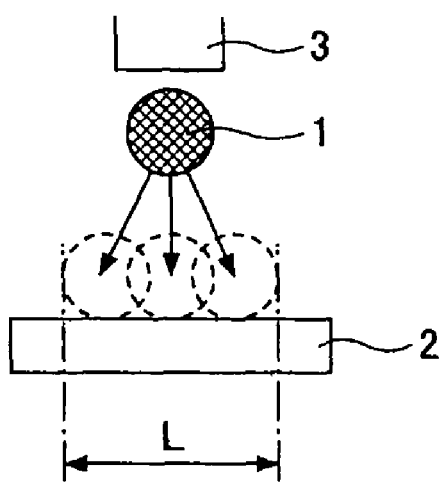
Figure 2A:
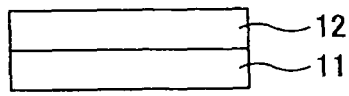
FIGS. 2A through 2G are drawings used to describe problems in a conventional method of forming a functional material pattern.
Figure 2B:
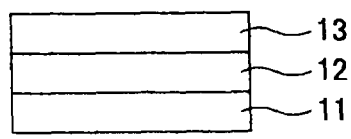
Figure 2C:
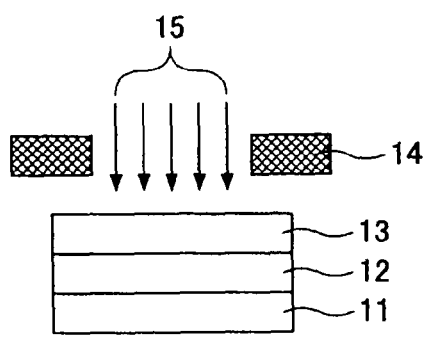
Figure 2D:
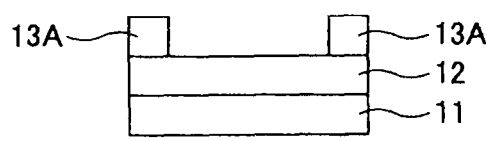
Figure 2E:
Figure 2F:
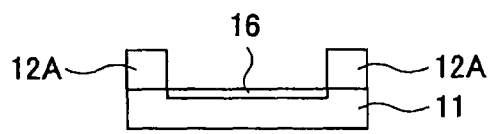
Figure 2G:
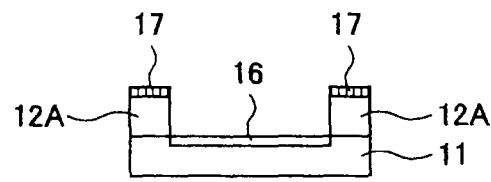

Preferred embodiments of the present invention are described below with reference to the accompanying drawings.

[Laminated Structure]

An exemplary laminated structure according to an embodiment of the present invention is described below. FIGS. 3A through 3C are drawings illustrating an exemplary laminated structure according to an embodiment of the present invention.

The exemplary laminated structure shown in FIGS. 3A through 3C includes a substrate 20 and a wettability-variable layer 30 formed on the substrate 20. The wettability-variable layer 30 contains a wettability-variable material whose surface energy changes when energy is applied. The wettability-variable layer 30 includes a high-surface-energy area 40 having high surface energy and a low-surface-energy area 50 having low surface energy. The high-surface-energy area 40 tends to lower free energy when brought into contact with a functional fluid described later and therefore has good wettability for a functional fluid. On the other hand, the low-surface-energy area 50 has poor wettability. These characteristics make it possible to selectively form a conductive layer (functional layer) 70 on the high-surface-energy area 40 by depositing drops of a functional fluid containing a conductive material (or a functional material) on the high-surface-energy area 40 (see FIGS. 6A through 6M). An exemplary composition of constituent layers is described below.

As the substrate 20, for example, a glass substrate, a silicon substrate, a stainless substrate, or a film substrate may be used. Examples of film substrates include a polyimide (PI) substrate, a polyether sulphone (PES) substrate, a polyethylene terephthalate (PET) substrate, and a polyethylene naphthalate (PEN) substrate.

The wettability-variable layer 30 contains a wettability-variable material whose surface energy (critical surface tension) changes when energy such as heat, an electron beam, ultraviolet light, or plasma is applied. As a wettability-variable material, a polymer material having a hydrophobic radical in the side chain of the polymer may be used. When energy such as ultraviolet light is applied to a high polymer material as described above, the energy breaks the bonding of the hydrophobic radical. As a result, the surface energy of the high polymer material changes from low to high. In other words, the property of the high polymer material changes from hydrophobic to hydrophilic. This characteristic of the wettability-variable material makes it possible to form a pattern comprising the high-surface-energy area 40 and the low-surface-energy area 50 on the wettability-variable layer 30 by exposing a portion of the wettability-variable layer 30 to ultraviolet light through a photomask having a corresponding pattern (see FIGS. 6C and 6D).

A high polymer where a side chain having a hydrophobic radical is bonded directly or via a linking group to a principal chain having a polyimide skeleton or a (meth)acrylate skeleton is preferably used. Polyimide is especially preferable in terms of solvent resistance, heat resistance, and insulation properties. Excellent solvent resistance widens the choice of solvents for a functional fluid, excellent heat resistance allows the wettability-variable layer 30 to resist heat that is applied when, for example, a functional fluid is evaporated, and excellent insulation properties make it possible to maintain insulation between the conductive layer (functional layer) 70 and the substrate 20.

As the hydrophobic radical of the side chain, for example, a fluoroalkyl group having a fluorine atom(s) or a hydrocarbon radical having no fluorine atom is preferably used.

As described above, the wettability-variable layer 30 includes the high-surface-energy area 40 and the low-surface-energy area 50 having different surface energies. This configuration makes it possible to selectively deposit a functional fluid containing a conductive material on the high-surface-energy area 40.

The high-surface energy area 40 includes a first area 40a and a second area 40b extending from the first area 40a and having a width smaller than that of the first area 40a.

When drops of a functional fluid containing a conductive material are deposited selectively on the first area 40a, the functional fluid flows into the second area 40b. As a result, the functional fluid covers the entire high-surface-energy area 40 (40a and 40b). This mechanism makes it possible to form a fine conductive pattern.

FIGS. 4A through 4H are drawings illustrating examples of the first area 40a and the second area 40b.

The first area 40a and the second area 40b may be formed linearly as shown in FIGS. 4A and 4B.

In FIGS. 4A and 4B, the directions of the width W1 of the first area 40a and the width W2 of the second area 40b are orthogonal to their respective extending directions.

The first area 40a may have a shape of a regular polygon or an ellipse as shown in FIGS. 4C and 4D, or may have other shapes such as a polygon and a circle.

In FIGS. 4C and 4D, the width W1 of the first area 40a equals the diameter of a circle inscribed in the first area 40a. When the first area 40a has a shape of a regular polygon, the width W1 is the diameter of a circle inscribed in the regular polygon; when the shape is a polygon, the width W1 is the diameter of a circle that is the smallest of circles touching internally any three sides of the polygon; when the shape is a circle, the width W1 is the diameter of the circle; and when the shape is an ellipse, the width W1 is the minor axis of the ellipse.

The second area 40b may have any shape as long as a functional fluid can flow into the second area 40b from the first area 40a. For example, the second area 40b may have a wavy shape.

Multiple second areas 40b extending from the first area 40a may be provided as shown in FIG. 4E. Providing multiple second areas 40b makes it possible to form various conductive patterns. For example, it is possible to form an opening in the conductive layer 70.

A tapered connecting area may be provided between the first area 40a and the second area 40b as shown in FIG. 4F. The tapered connecting area enables a functional fluid containing a conductive material to flow smoothly from the first area 40a into the second area 40b.

Also, a third area 40c extending from the second area 40b and having a width smaller than that of the second area 40b may be provided as shown in FIG. 4G. In FIG. 4G, the width of the high-surface-energy area 40 becomes gradually smaller from the first area 40a to the third area 40c. This structure enables a functional fluid containing a conductive material to flow smoothly from the first area 40a into the third area 40c.

Further, a third area 40d extending from the second area 40b and having a width larger than that of the second area 40b may be provided as shown in FIG. 4H. With this structure, a functional fluid containing a conductive material drains from the second area 40b into the third area 40d. This facilitates flow of the functional fluid from the first area 40a into the second area 40b.

The conductive layer (functional layer) 70 is formed on the high-surface-energy area 40 by depositing drops of a functional fluid containing a conductive material selectively on the first area 40a, allowing the functional fluid to flow into the second area 40b so that the entire high-surface-energy area 40 is covered by the functional fluid, and evaporating the functional fluid (see FIGS. 6E through 6M).

A conductive-material-containing functional fluid may be prepared by dispersing or dissolving a conductive material in a solvent. Examples of conductive-material-containing functional fluids include a nano metal ink obtained by dispersing metal microparticles of, for example, Au, Ag, Cu, Al, Ni, or Pd in a solvent or water and an aqueous solution of a conductive polymer made by doping, for example, polyaniline (PANI) or polyethylene-dioxithiophene (PEDOT) with polystyrene sulfonate (PSS).

The mechanism of how a functional fluid deposited on the first area 40a flows into the second area 40b is described below.

Figure 5A:
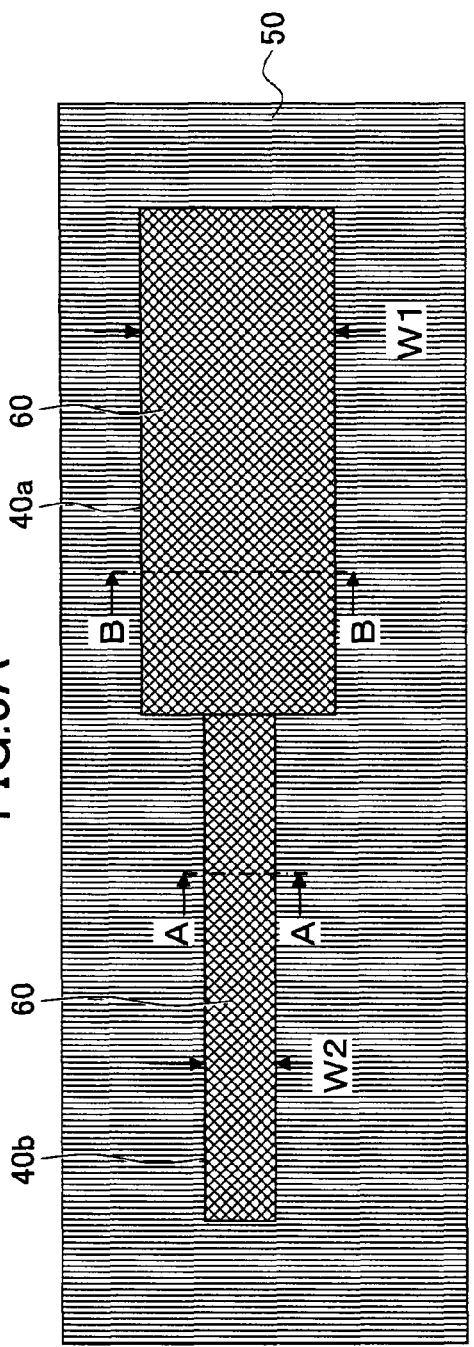
FIGS. 5A through 5C are drawings illustrating a functional fluid spread across a high-surface-energy area 40.
Figure 5C:
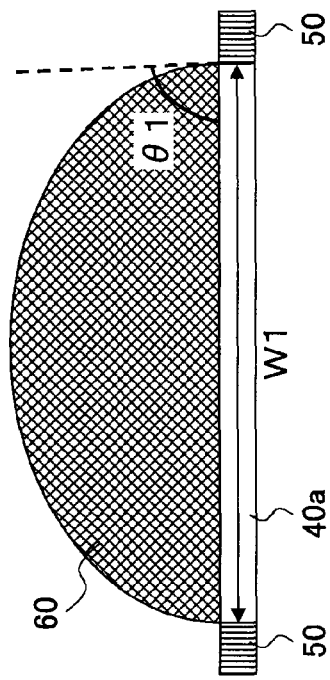
Figure 5B:
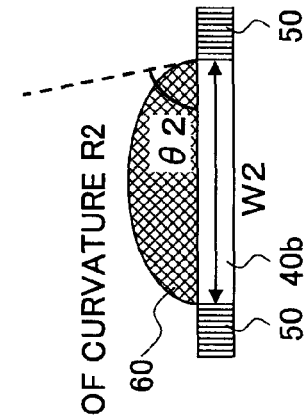

FIGS. 5A through 5C are drawings illustrating a functional fluid spread across the high-surface-energy area 40. FIG. 5A is a top view, FIG. 5B is a cross-sectional view taken along line A-A, and FIG. 5C is a cross-sectional view taken along line B-B of the high-surface-energy area 40.

As shown in FIG. 5A, the first area 40a and the second area 40b are arranged linearly such that their longitudinal axes align. The cross section of a functional fluid 60 is shaped like a segment of a circle as shown in FIGS. 5B and 5C.

The internal pressure of the functional fluid 60, known as Laplace pressure, is in inverse proportion to the radius of curvature of the cross section of the functional fluid 60. When the radius of curvature R1 of the functional fluid 60 on the first area 40a is different from the radius of curvature R2 of the functional fluid 60 on the second area 40b, the functional fluid 60 flows because of the difference (P1−P2) between the internal pressure P1 of the functional fluid 60 on the first area 40a and the internal pressure P2 of the functional fluid 60 on the second area 40b. The radius of curvature R1 must be smaller than the radius of curvature R2 for the functional fluid 60 to flow from the first area 40a into the second area 40b.

The radius of curvature R1 and the radius of curvature R2 can be approximated by the following formulas based on the width W1 of the first area 40a, the width W2 of the second area 40b, the angle θ1 between a tangent to the surface of the functional fluid 60 and the surface of the first area 40a at the boundary with the low-surface-energy area 50, and the angle θ2 between a tangent to the surface of the functional fluid 60 and the surface of the second area 40b at the boundary with the low-surface-energy area 50 (see FIGS. 5B and 5C).

$$R1 = \frac{W1}{2\sin\theta 1} \qquad \text{[Formula 1]}$$
$$R2 = \frac{W2}{2\sin\theta 2}$$

As is apparent from the above formulas, to make the radius of curvature R1 smaller than the radius of curvature R2, it is necessary to make the ratio (W1/W2) between the width W1 of the first area 40a and the width W2 of the second area 40b close to 1 and to make the angle θ1 larger than the angle θ2.

At the boundary between the high-surface-energy area 40 and the low-surface-energy area 50, the angle θ1 or the angle θ2 can take a value between the contact angle of the functional fluid 60 with the high-surface-energy area 40 and the contact angle of the functional fluid 60 with the low-surface energy area 50.

For the functional fluid 60 to be able to flow from the first area 40a into the second area 40b, the internal pressure P1 obtained when the angle θ1 is at the maximum must be larger than the internal pressure P2 obtained when the angle θ2 is at the minimum.

In other words, whether the functional fluid 60 flows from the first area 40a into the second area 40b depends on the ratio between the width W1 of the first area 40a and the width W2 of the second area 40b, the contact angle of the functional fluid 60 with the high-surface-energy area 40, and the contact angle of the functional fluid 60 with the low-surface-energy area 50.

For example, if the width W2 of the second area 40b is too small relative to the width W1 of the first area 40a, the internal pressure P1 corresponding to the maximum angle θ1 cannot exceed the internal pressure P2 corresponding to the minimum angle θ2 and therefore the functional fluid 60 does not flow from the first area 40a into the second area 40b. In such a case, if additional functional fluid 60 is supplied to the first area 40a, the functional fluid 60 may overflow into the low-surface energy area 50.

In the above descriptions, it is assumed that the cross-sectional shapes of the functional fluid 60 on the first area 40a and the second area 40b are stable, and influence of the viscosity of the functional fluid 60 on its fluidity and influence of drying of the functional fluid 60 are not taken into account. Still, as described above, whether the functional fluid 60 flows from the first area 40a into the second area 40b depends on the ratio (W1/W2) between the width W1 of the first area 40a and the width W2 of the second area 40b, the contact angle of the functional fluid 60 with the high-surface-energy area 40, and the contact angle of the functional fluid 60 with the low-surface-energy area 50.

[Method of Producing Laminated Structure]

An exemplary method of producing a laminated structure according to an embodiment of the present invention is described below. FIGS. 6A through 6M are drawings illustrating a method of producing an exemplary laminated structure according to an embodiment of the present invention. In the descriptions below, the same reference numbers are used for parts corresponding to those of the exemplary laminated structure described above and detailed descriptions of those parts are omitted.

Figure 6A:
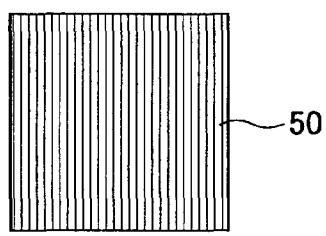
FIGS. 6A through 6M are drawings illustrating a method of producing an exemplary laminated structure according to an embodiment of the present invention.
Figure 6B:
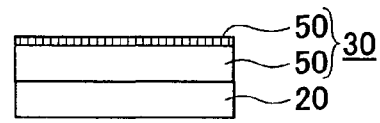
Figure 6C:
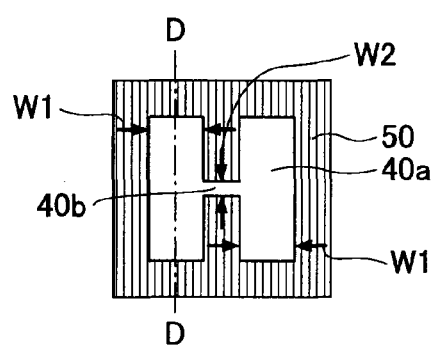
Figure 6D:
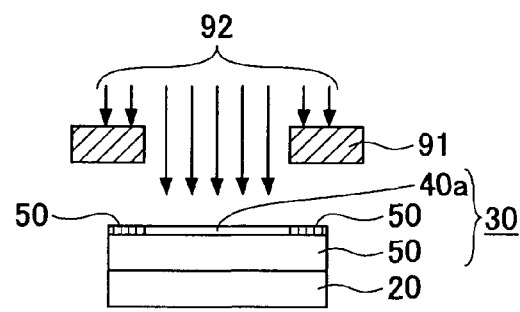
Figure 6E:
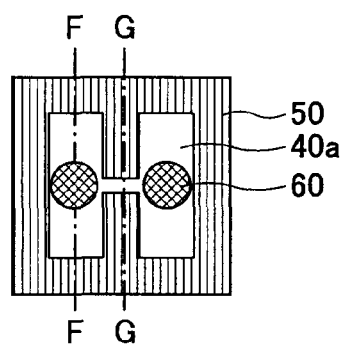
Figure 6F:
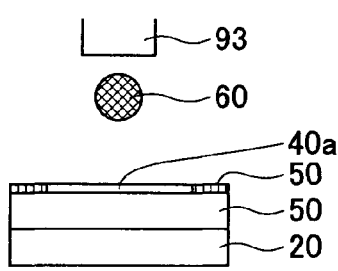
Figure 6G:
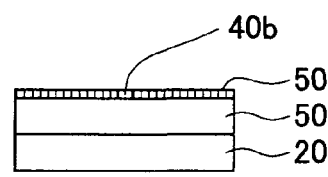

An exemplary laminated structure production method of this embodiment includes a first step of forming the wettability-variable layer 30 (FIGS. 6A and 6B) and a second step of applying energy such as ultraviolet light to a portion of the wettability-variable layer 30 and thereby forming the low-surface-energy area 50 and the high-surface-energy area 40 on the wettability-variable layer 30 (FIGS. 6C and 6D). The high-surface energy area 40 includes the first area 40a and the second area 40b extending from the first area 40a and having a width smaller than that of the first area 40a. The exemplary laminated structure production method of this embodiment also includes a third step of depositing drops of the functional fluid 60 containing a functional material onto the first area 40a and allowing the functional fluid 60 to flow into the second area 40b so that the functional fluid 60 covers the entire high-surface-energy area 40 (40a and 40b) (FIGS. 6E through 6J), and a fourth step of forming the functional layer 70 by evaporating the functional fluid 60 spread across the high-surface-energy area 40 (FIGS. 6K through 6M).

In the first step corresponding to FIGS. 6A and 6B, a liquid containing a wettability-variable material is applied to the upper surface of the substrate 20, for example, by spin coating and the liquid is evaporated to form the wettability-variable layer 30. In this example, it is assumed that a polymer material having a hydrophobic radical in the side chain of the polymer is used as the wettability-variable material. Therefore, the wettability-variable layer 30 is formed as the low-surface-energy area 50 on the substrate 20.

In the second step corresponding to FIGS. 6C and 6D, a portion of the wettability-variable layer 30 is exposed to ultraviolet light 92 through a photomask 91. The ultraviolet light 92 breaks the bonding of the hydrophobic radical of the wettability-variable material and thereby changes the surface energy of the exposed portion of the wettability-variable layer 30 from low to high. As a result, the high-surface-energy area 40 and the low-surface-energy area 50 are formed on the wettability-variable layer 30. The high-surface energy area 40 includes the first area 40a and the second area 40b extending from the first area 40a and having a width smaller than that of the first area 40a.

Thus, the exemplary production method of this embodiment makes it possible to form the high-surface-energy area 40 and the low-surface-energy area 50 through two steps (first and second steps). In other words, compared with the production method disclosed in patent document 3 which involves seven steps, the exemplary production method described above makes it possible to produce a laminated structure with a smaller number of steps.

In the third step corresponding to FIGS. 6E through 6J, drops of the functional fluid 60 containing a functional material are jetted by a liquid-jetting nozzle 93 selectively onto the first area 40a. For depositing the functional fluid 60 on the first area 40a, inkjet methods and dispensing methods may be used. Inkjet methods enable jetting fine droplets of a low-viscosity liquid accurately onto a target surface without contact with the surface and are therefore preferable.

Examples of functional materials include a conductive material, an insulating material, and a semiconductor that are used, respectively, to form a conductive layer, an insulating layer, and a semiconductor layer.

Figure 7:
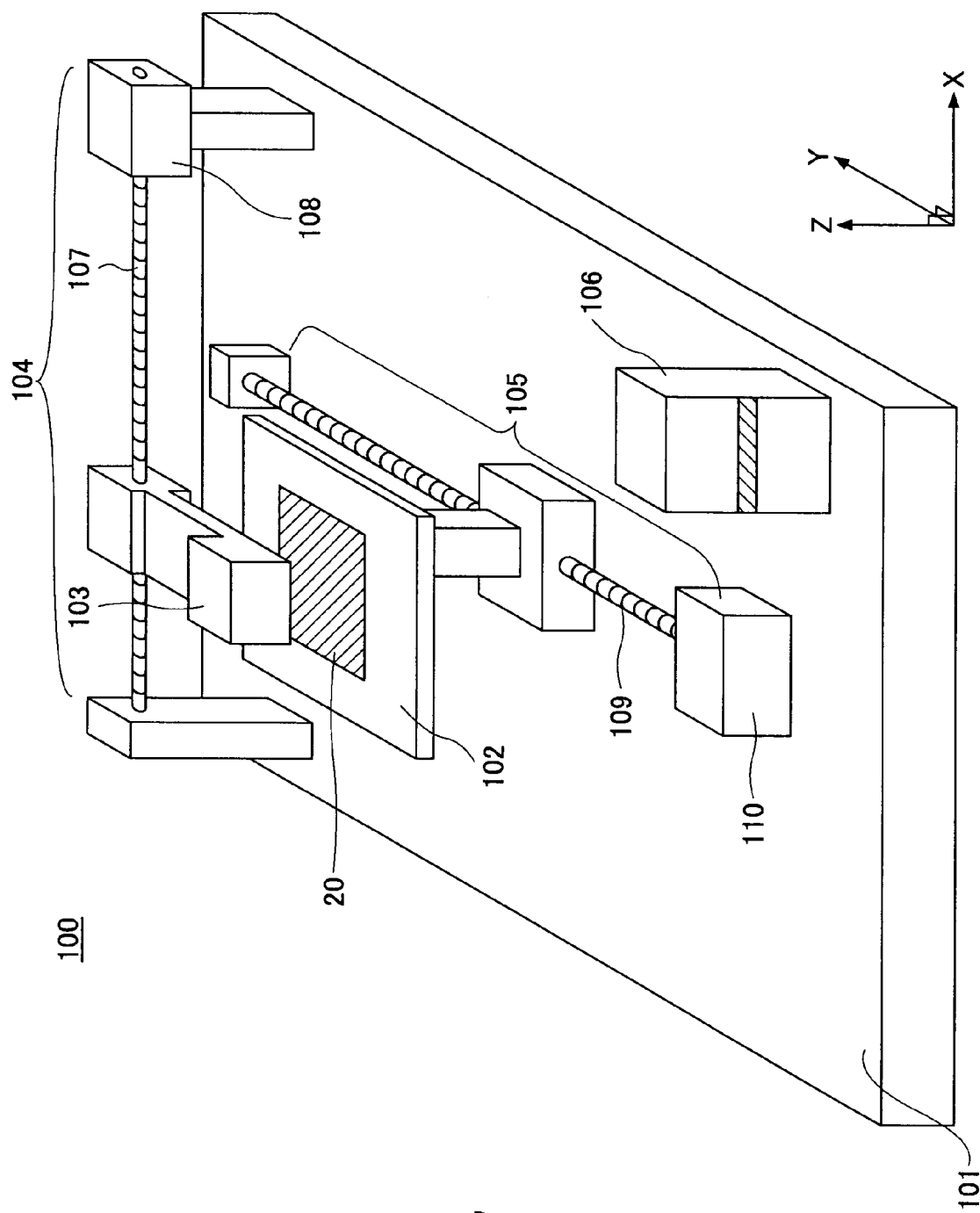
FIG. 7 is a drawing illustrating an exemplary configuration of an inkjet device according to an embodiment of the present invention.

FIG. 7 is a drawing illustrating an exemplary configuration of an inkjet device according to an embodiment of the present invention. As shown in FIG. 7, an inkjet device 100 includes a surface plate 101, a stage 102, an inkjet head 103, an X-axis direction movement mechanism 104 connected to the inkjet head 103, a Y-axis direction movement mechanism 105 connected to the stage 102, and a control unit 106.

The stage 102 supports a substrate 20 and includes a mechanism, for example, a suction device (not shown) for holding the substrate 20. The stage 102 may also be equipped with a heating mechanism for evaporating the functional liquid 60 jetted onto the substrate 20.

The inkjet head 103 has multiple inkjet nozzles arranged at regular intervals in the X-axis direction on its under surface. The functional fluid 60 is jetted from the inkjet nozzles onto the substrate 20 held on the stage 102. The inkjet head 103 also includes an ink-jetting mechanism comprising, for example, piezoelectric elements (not shown). When a voltage is applied to the piezoelectric elements, the functional fluid 60 is jetted from the inkjet nozzles.

The X-axis direction movement mechanism 104 includes an X-axis direction drive shaft 107 and an X-axis direction drive motor 108. The X-axis direction drive motor 108 is implemented by, for example, a stepper motor. When an X-axis direction driving signal is supplied from the control unit 106, the X-axis direction drive motor 108 rotates the X-axis direction drive shaft 107 and thereby moves the inkjet head 103 in the X-axis direction.

The Y-axis direction movement mechanism 105 includes a Y-axis direction drive shaft 109 and a Y-axis direction drive motor 110. When a Y-direction driving signal is supplied from the control unit 106, the Y-axis direction drive motor 110 rotates the Y-axis direction drive shaft 109 and thereby moves the stage 102 in the Y-axis direction.

The control unit 106 supplies an inkjet control signal to the inkjet head 103, an X-axis direction driving signal to the X-axis direction drive motor 108, and a Y-axis direction driving signal to the Y-axis direction drive motor 110. The control unit 106 is connected to the inkjet head 103, the X-axis direction drive motor 108, and the Y-axis direction drive motor 110 by wiring (not shown).

The inkjet device 100 causes the inkjet head 103 to jet the functional fluid 60 onto the substrate 20 held on the stage 102 while moving the inkjet head 103 and the stage 102 relative to each other. The inkjet device 100 may also include a rotation mechanism between the inkjet head 103 and the X-axis direction movement mechanism 104 which rotation mechanism operates independently from the X-axis direction movement mechanism 104. The rotation mechanism changes the relative angle between the inkjet head 103 and the stage 102 and thereby adjusts the pitch between the inkjet nozzles. Also, the inkjet device 100 may include a Z-axis direction movement mechanism between the inkjet head 103 and the X-axis direction movement mechanism 104 which Z-axis direction movement mechanism operates independently from the X-axis direction movement mechanism 104. The Z-axis direction movement mechanism moves the inkjet head 103 in the Z-axis direction and thereby adjusts the distance between the substrate 20 and the nozzle surface of the inkjet head 103. Further, the inkjet device 100 may include a rotation mechanism between the stage 102 and the Y-axis direction movement mechanism 105 which rotation mechanism operates independently from the Y-axis direction movement mechanism 105. The rotation mechanism rotates the stage 102 and thereby makes it possible to jet a functional liquid onto the substrate 20 tilted at a specified angle.

The functional fluid 60 preferably has properties that enable the inkjet head 103 to stably jet the functional fluid 60. The surface tension of the functional fluid 60 is preferably between 20 mN/m and 50 mN/m and more preferably about 30 mN/m to stabilize the meniscus of the functional fluid 60 at the nozzle tip of the inkjet head 103 and to stabilize the shapes and traveling speeds of drops of the functional fluid 60 jetted from the inkjet head 103. The viscosity of the functional fluid 60 is preferably between 2 mPa·s and 50 mPa·s. More preferably, the viscosity of the functional fluid 60 is as small as possible within the above range so that the functional fluid 60 jetted onto the first area 40*a* can smoothly flow into the second area 40*b*.

Figure 6H:
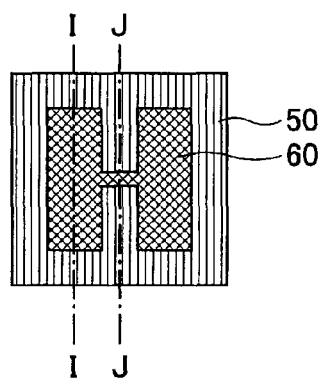
Figure 6I:
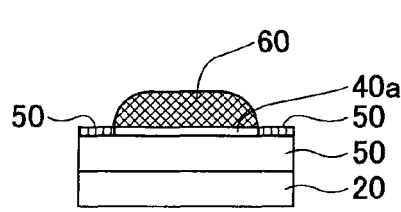
Figure 6J:
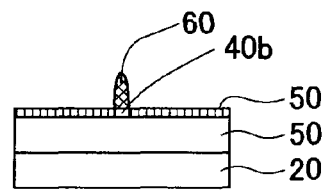
Figure 6K:
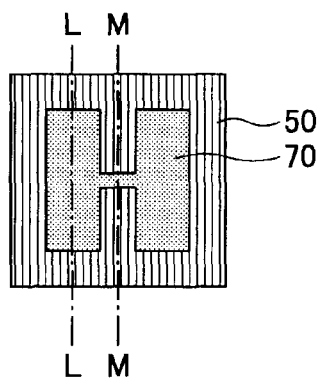
Figure 6L:
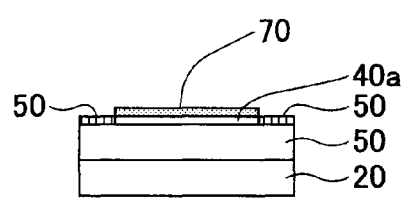
Figure 6M:
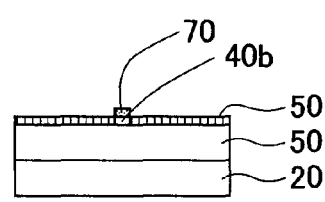

As shown in FIGS. 6H through 6J, the functional fluid 60 jetted onto the first area 40*a* flows into the second area 40*b* and, as a result, the functional fluid 60 spreads across the entire high-surface-energy area 40 (40*a* and 40*b*).

In the fourth step corresponding to FIGS. 6K through 6M, the functional fluid 60 spread across the entire high-surface-energy area 40 is evaporated and fixed to form the functional layer 70.

Methods for evaporating the functional fluid 60 include a convection heat transfer method using, for example, an oven; a conductive heat transfer method using, for example, a hot plate; and a radiant heat transfer method using, for example, far-infrared rays or microwaves. Evaporation is not necessarily done at atmospheric pressure but may also be done at a reduced pressure. Additionally, the evaporated and fixed functional layer 70 may be heat-treated. For example, when a nano metal ink is used as the functional fluid 60, it is difficult to achieve sufficient electrical conductivity just by evaporating and fixing the functional fluid 60 and therefore it is necessary to fuse nanoparticles by heat-treating the functional fluid 60.

According to the above embodiment, the functional fluid 60 containing a functional material is jetted onto the first area 40*a* and allowed to flow into the second area 40*b* having a width smaller than that of the first area 40*a*. This method makes it possible to form a fine functional material pattern.

[Active Matrix Substrate]

An exemplary configuration of an active matrix substrate according to an embodiment of the present invention is described below.

Figure 8B:
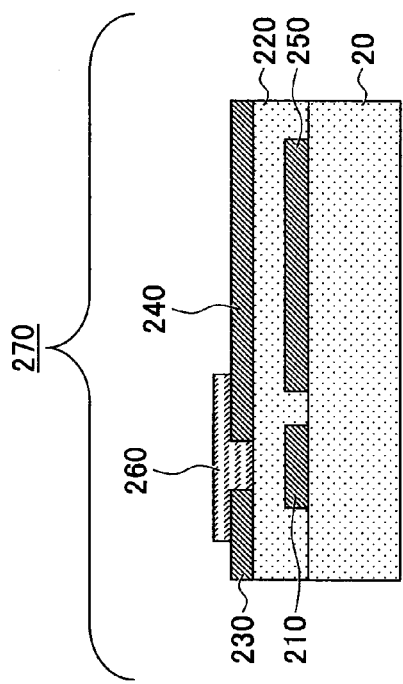
FIGS. 8A and 8B are drawings illustrating an exemplary configuration of a conventional active matrix substrate.
Figure 8A:
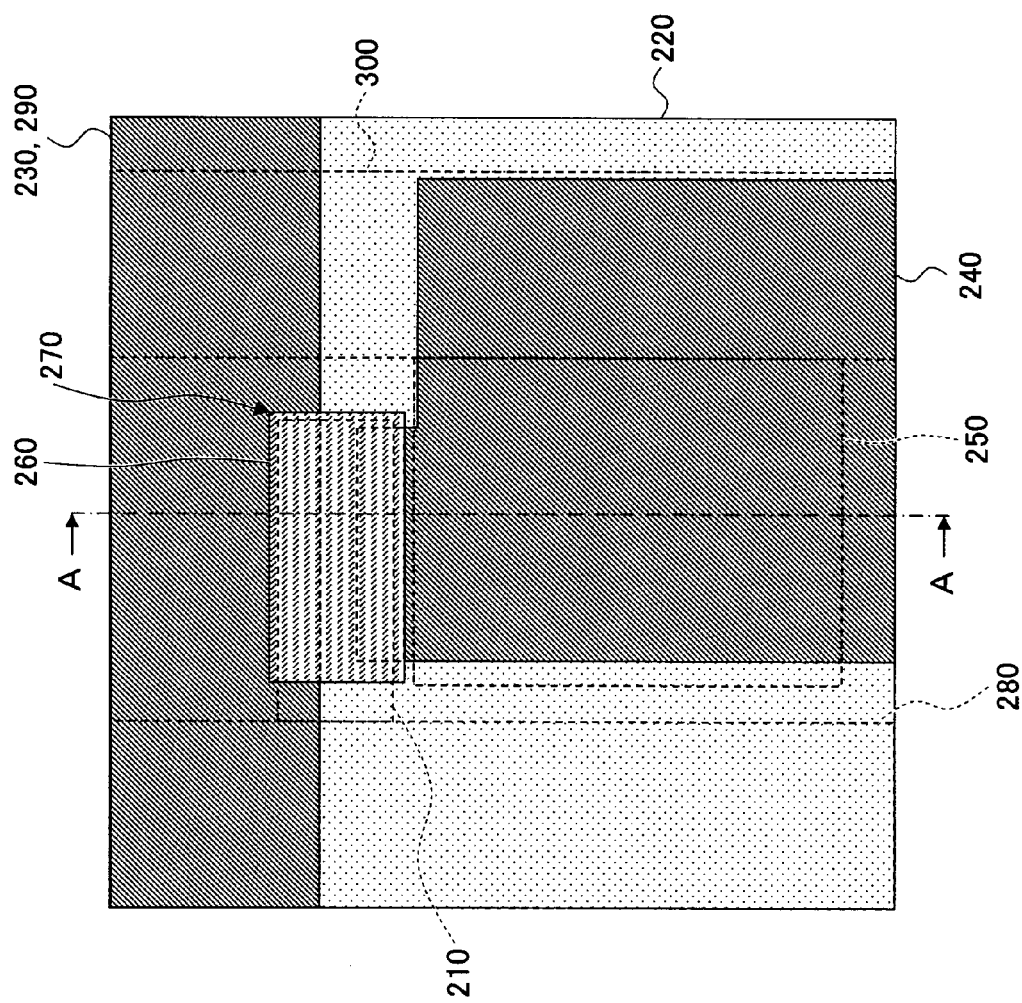

FIGS. 8A and 8B are drawings illustrating an exemplary configuration of a conventional active matrix substrate. FIG. 8A is a top view and FIG. 8B is a cross-sectional view taken along line A-A of the conventional active matrix substrate.

As shown in FIG. 8, the conventional active matrix substrate comprises a transistor 270 including a gate electrode 210, a gate insulating layer 220, a source electrode 230, a drain electrode 240, a capacitor electrode 250, and a semiconductor 260; a gate signal line 280 extending from the gate electrode 210 in an arbitrary direction; a source signal line 290 extending from the source electrode 230 in a direction substantially orthogonal to the direction of the gate signal line 280; and a common signal line 300 extending from the capacitor electrode 250 in a direction substantially parallel to the direction of the gate signal line 280 or the source signal line 290. In FIG. 8, the source signal line 290 also functions as the source electrode 230.

An exemplary active matrix substrate according to an embodiment of the present invention includes a laminated structure as described in the above embodiments. The exemplary active matrix substrate of this embodiment also includes components corresponding to those of the conventional active matrix substrate shown in FIGS. 8A and 8B. The conductive layer 70 (or the functional layer 70) of the laminated structure is used at least as the gate electrode 210, the source electrode 230, the drain electrode 240, the capacitor electrode 250, the gate signal line 280, the source signal line 290, or the common signal line 300. How the conductive layer 70 is used in the exemplary active matrix substrate is described below with reference to drawings. In the descriptions below, the same reference numbers are used for parts corresponding to those of the exemplary laminated structure described above and detailed descriptions of those parts are omitted.

Figure 9A:
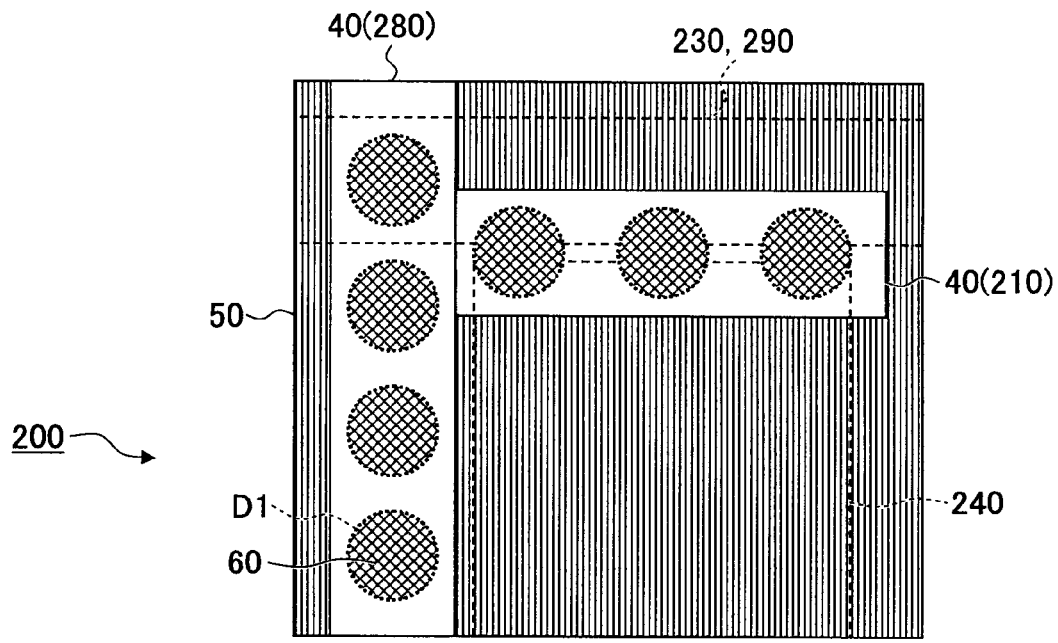
FIGS. 9A and 9B are drawings illustrating exemplary methods of forming a gate electrode and a gate signal line.
Figure 9B:
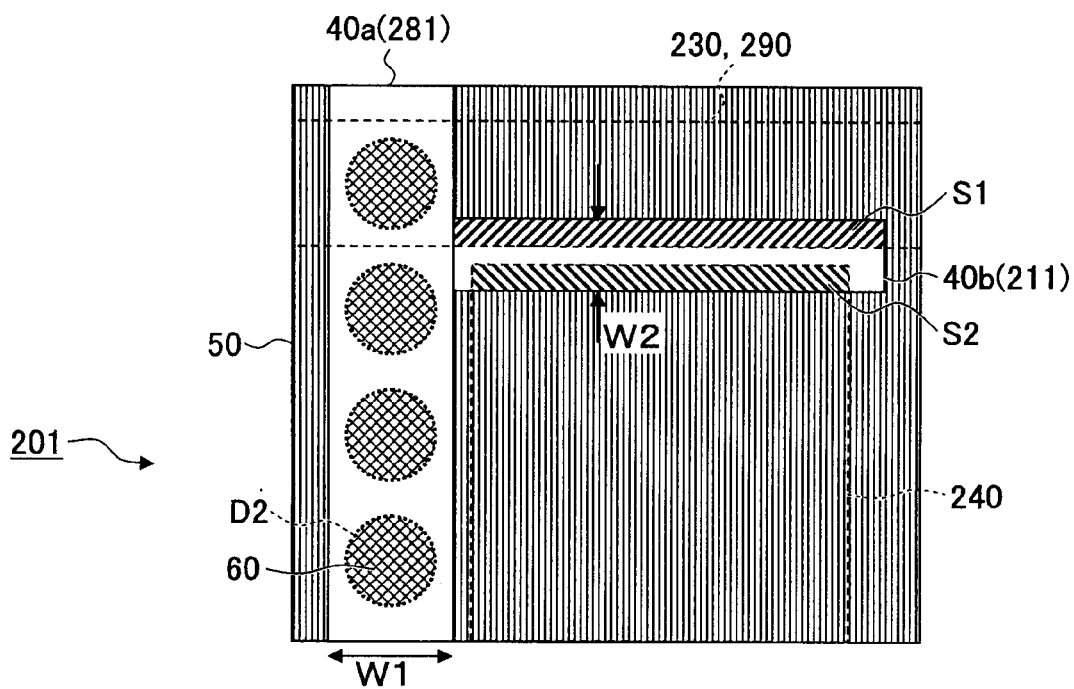

FIG. 9A is a top view of a conventional active matrix substrate 200 where the gate electrode 210 and the gate signal line 280 are formed. FIG. 9B is a top view of an active matrix substrate 201 of this embodiment where a gate electrode 211 and a gate signal line 281 are formed.

In the case of the conventional active matrix substrate 200, as shown in FIG. 9A, the gate electrode 210 and the gate signal line 280 are formed by depositing drops of the functional fluid 60 on positions D1 throughout the high-surface-energy area 40.

As shown in FIG. 9B, the active matrix substrate 201 of this embodiment includes the first area 40*a* and the second area 40*b* extending from the first area 40*a* and having a width smaller than that of the first area 40*a*. In the case of the active matrix substrate 201, drops of the functional fluid 60 are selectively deposited on positions D2 in the first area 40*a*. The deposited functional fluid 60 flows into the second area 40*b* and thereby covers the entire high-surface-energy area 40 (40*a* and 40*b*). As a result, the gate signal line 281 is formed on the first area 40*a* and the gate electrode 211 is formed on the second area 40*b*.

Thus, in the case of the active matrix substrate 201, the functional fluid 60 is not directly deposited on the second area 40*b*. This method makes it possible to form a very fine gate electrode 211. Also, this method makes it possible to reduce an overlap area S1 between the gate electrode 211 and the source electrode 230 and an overlap area S2 between the gate electrode 211 and the drain electrode 240 to thereby reduce gate leakage current of the transistor 270 and increase the operating speed of the transistor 270.

Figure 10A:
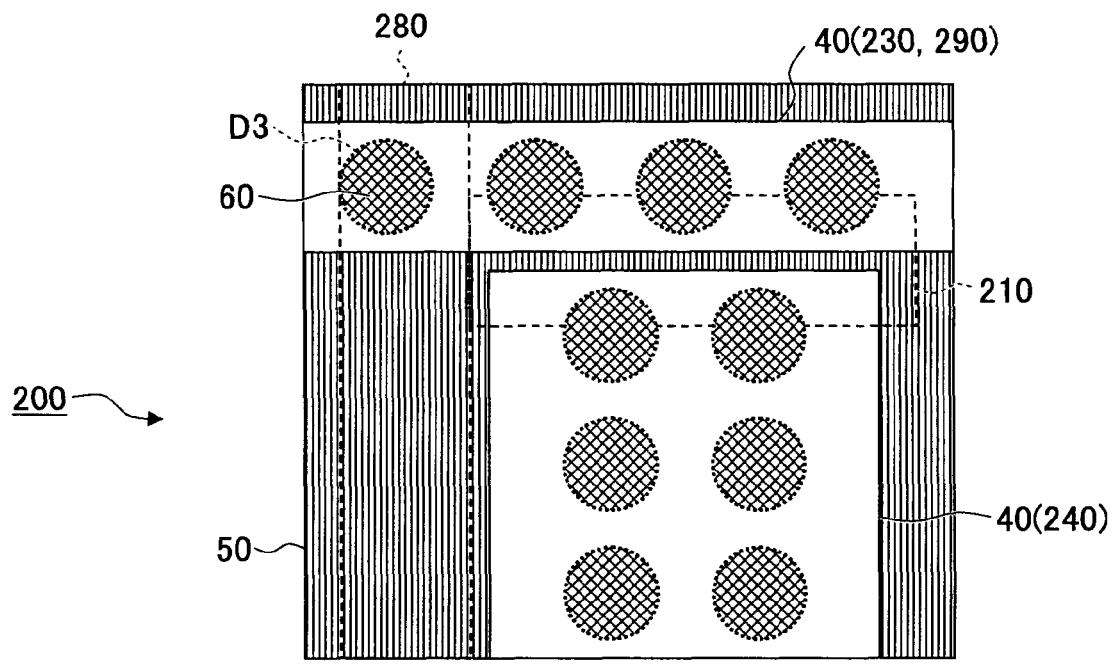
FIGS. 10A and 10B are drawings illustrating exemplary methods of forming a source electrode and a source signal line.
Figure 10B:
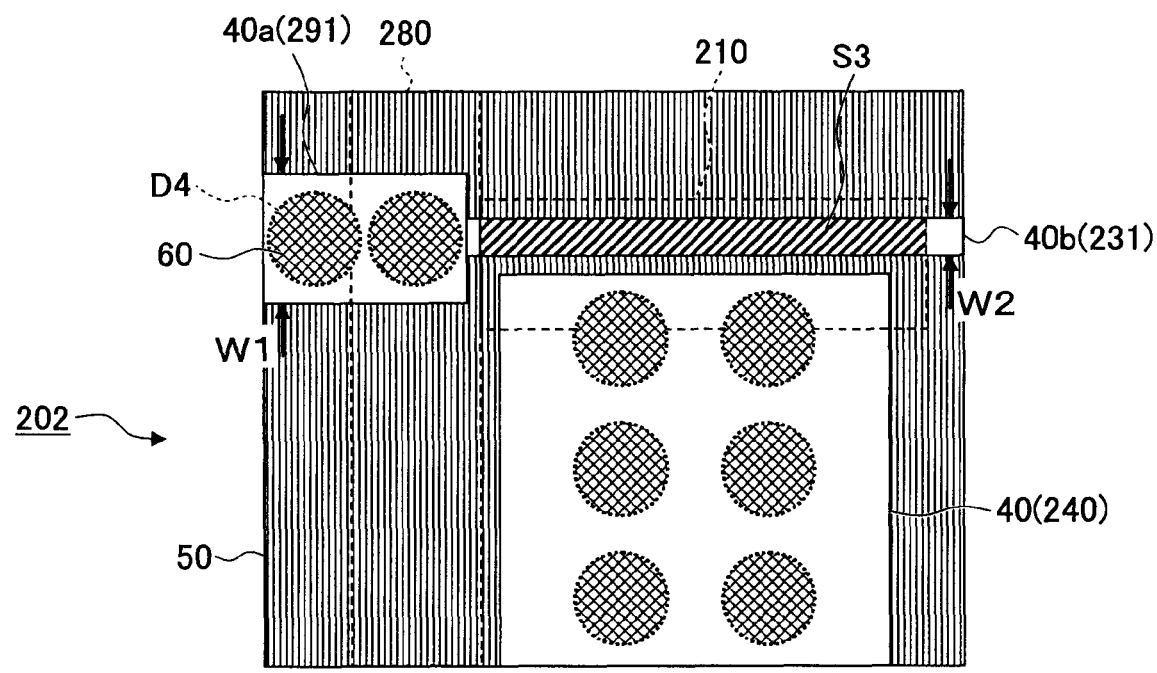

FIG. 10A is a top view of the conventional active matrix substrate 200 where the source electrode 230 and the source signal line 290 are formed. FIG. 10B is a top view of an active matrix substrate 202 of this embodiment where a source electrode 231 and a source signal line 291 are formed.

In the case of the conventional active matrix substrate 200, as shown in FIG. 10A, the source electrode 230 and the source signal line 290 are formed by depositing drops of the functional fluid 60 on positions D3 throughout the high-surface-energy area 40.

As shown in FIG. 10B, the active matrix substrate 202 of this embodiment includes the first area 40a and the second area 40b extending from the first area 40a and having a width smaller than that of the first area 40a. In the case of the active matrix substrate 202, drops of the functional fluid 60 are selectively deposited on positions D4 in the first area 40a. The deposited functional fluid 60 flows into the second area 40b and thereby covers the entire high-surface-energy area 40 (40a and 40b). As a result, the source signal line 291 is formed on the first area 40a and the source electrode 231 is formed on the second area 40b.

Thus, in the case of the active matrix substrate 202, the functional fluid 60 is not directly deposited on the second area 40b. This method makes it possible to form a very fine source electrode 231. Also, this method makes it possible to reduce an overlap area S3 between the source electrode 231 and the gate electrode 210 to thereby reduce gate leakage current of the transistor 270 and increase the operating speed of the transistor 270. Also, this method contributes to saving space on the active matrix substrate 202 and thereby makes it possible, for example, to increase the size of the drain electrode 240. Further, since the functional fluid 60 is not directly deposited on the second area 40b, this method makes it possible to reduce short circuits between the source electrode 231 and the drain electrode 240.

Figure 11A:
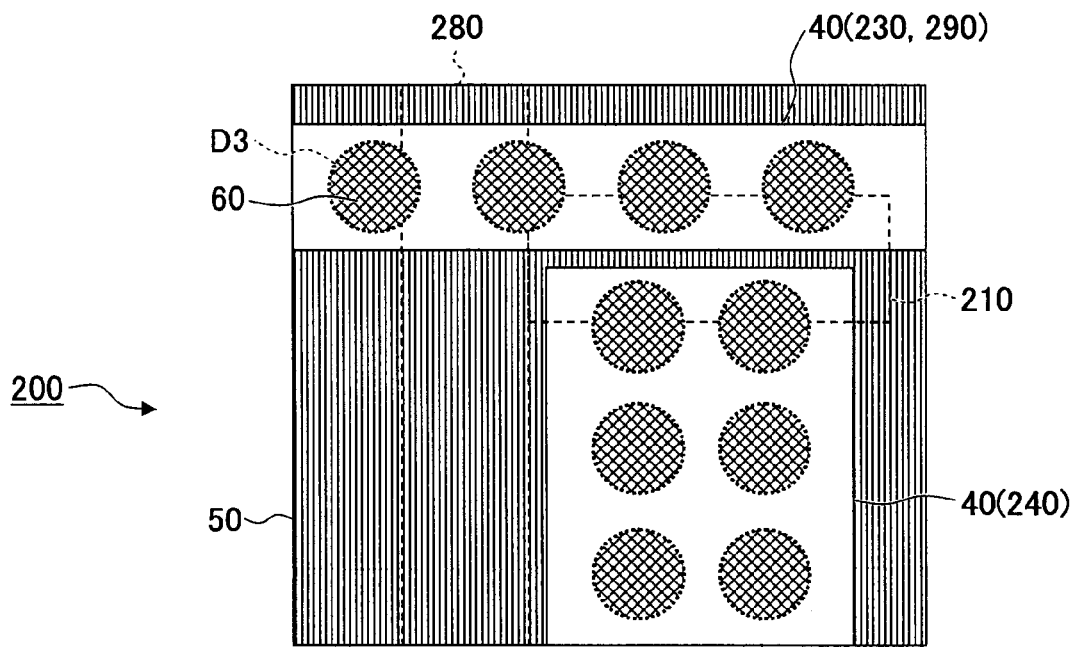
FIGS. 11A and 11B are drawings illustrating exemplary methods of forming a drain electrode.
Figure 11B:
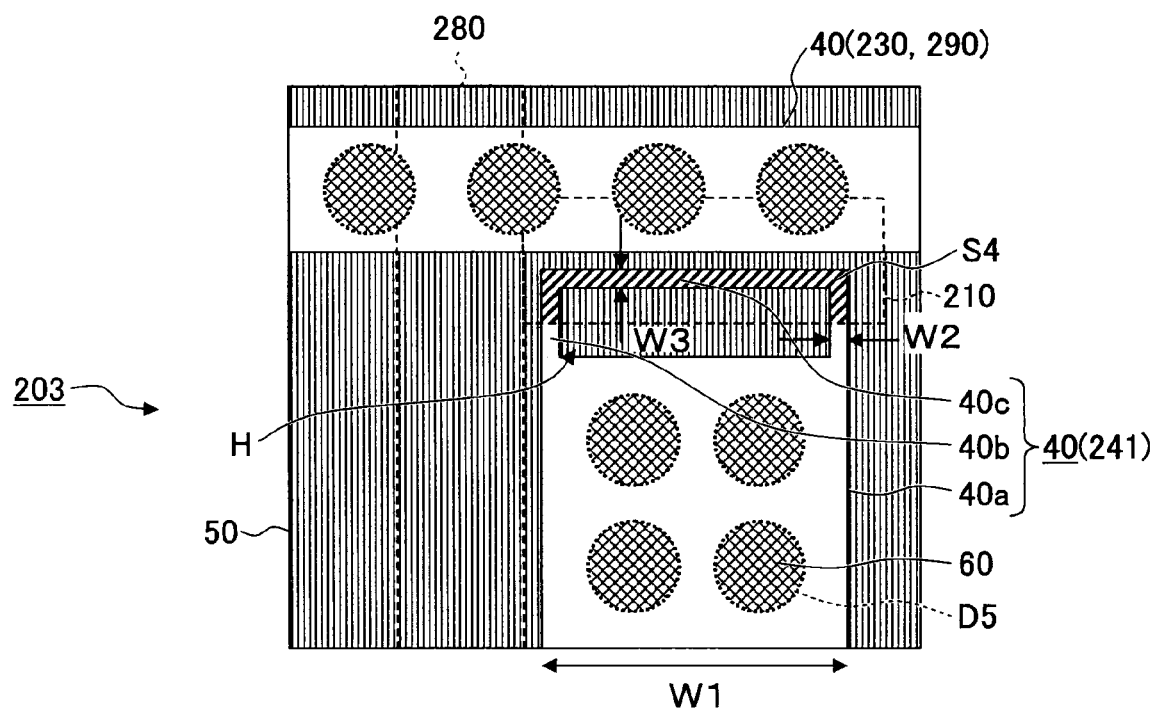

FIG. 11A is a top view of the conventional active matrix substrate 200 where the drain electrode 240 is formed. FIG. 11B is a top view of an active matrix substrate 203 of this embodiment where a drain electrode 241 is formed.

In the case of the conventional active matrix substrate 200, as shown in FIG. 11A, the drain electrode 240 is formed by depositing drops of the functional fluid 60 on positions D3 throughout the high-surface-energy area 40.

As shown in FIG. 11B, the active matrix substrate 203 of this embodiment includes the first area 40a, the second area 40b extending from the first area 40a and having a width smaller than that of the first area 40a, and a third area 40c extending from the second area 40b. In the case of the active matrix substrate 203, drops of the functional fluid 60 are selectively deposited on positions D5 in the first area 40a. The deposited functional fluid 60 flows into the second area 40b and then into the third area 40c to thereby cover the entire high-surface-energy area 40 (40a, 40b, and 40c). As a result, the drain electrode 241 having an opening H is formed on the high-surface-energy area 40 (40a, 40b, and 40c).

Thus, in the case of the active matrix substrate 203, the functional fluid 60 is not directly deposited on the second area 40b and the third area 40c. This method makes it possible to form the drain electrode 241 having the opening H. Also, this method makes it possible to reduce an overlap area S4 between the drain electrode 241 and the gate electrode 210 to thereby reduce gate leakage current of the transistor 270 and increase the operating speed of the transistor 270.

In this embodiment, the opening H is formed in the drain electrode 241. In a similar manner, an opening may be formed in the source electrode 230. Forming an opening in the source electrode 230 reduces an overlap area between the source electrode 230 and the gate electrode 210. Also, an opening may be formed in the source signal line 290 (or 291). Forming an opening in the source signal line 290 (or 291) reduces an overlap area between the source signal line 290 (or 291) and the gate electrode 210 or the gate signal line 280 (or 281).

Figure 12A:
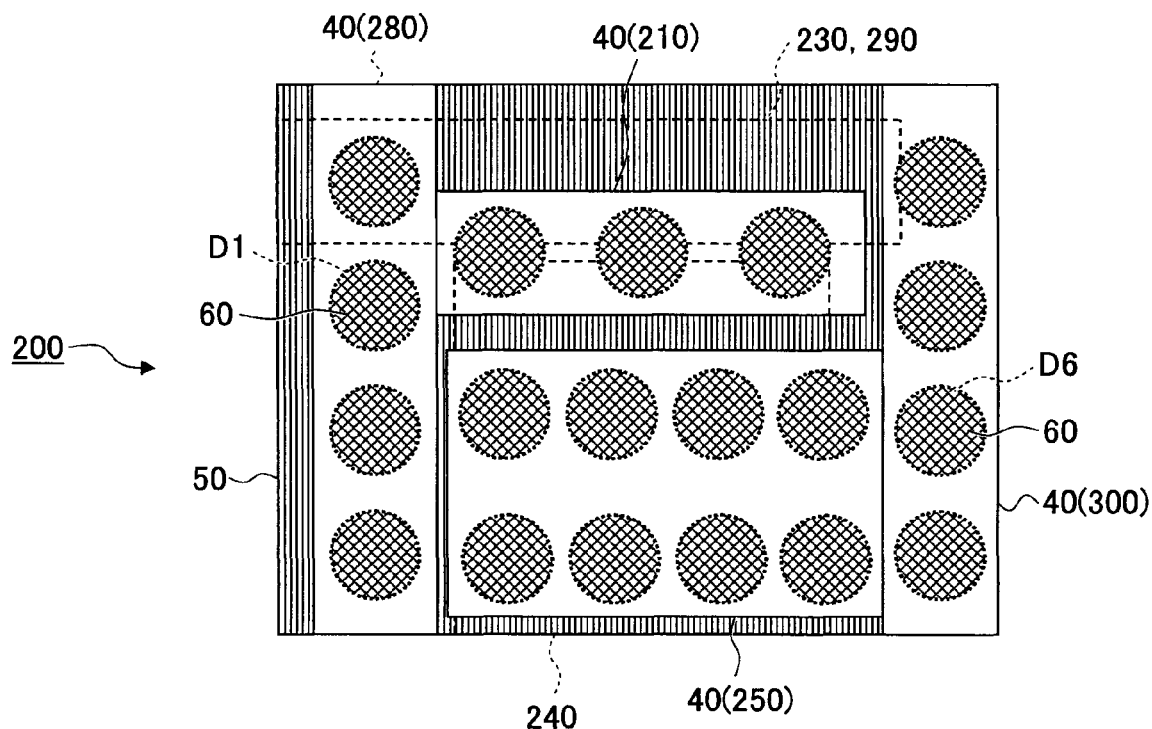
FIGS. 12A and 12B are drawings illustrating exemplary methods of forming a capacitor electrode and a common signal line.
Figure 12B:
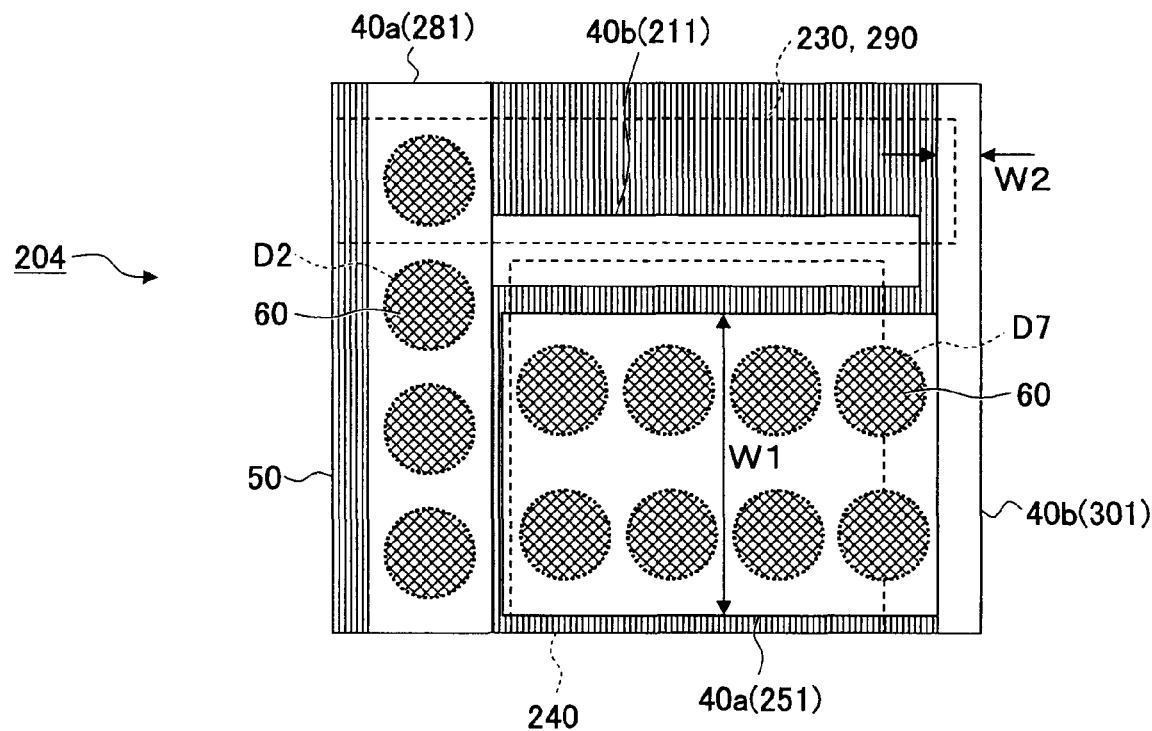

FIG. 12A is a top view of the conventional active matrix substrate 200 where the capacitor electrode 250 and the common signal line 300 are formed. FIG. 12B is a top view of an active matrix substrate 204 of this embodiment where a capacitor electrode 251 and a common signal line 301 are formed. In FIGS. 12A and 12B, the gate electrodes 210 and 211 and the gate signal lines 280 and 281 are formed in addition to the capacitor electrodes 250 and 251 and the common signal lines 300 and 301. The methods of forming the gate electrodes and the gate signal lines are substantially the same as those described with reference to FIGS. 9A and 9B and descriptions of the methods are omitted here.

In the case of the conventional active matrix substrate 200, as shown in FIG. 12A, the capacitor electrode 250 and the common signal line 300 are formed by depositing drops of the functional fluid 60 on positions D6 throughout the high-surface-energy area 40.

As shown in FIG. 12B, the active matrix substrate 204 of this embodiment includes the first area 40a and the second area 40b extending from the first area 40a and having a width smaller than that of the first area 40a. In the case of the active matrix substrate 204, drops of the functional fluid 60 are selectively deposited on positions D7 in the first area 40a. The deposited functional fluid 60 flows into the second area 40b and thereby covers the entire high-surface-energy area 40 (40a and 40b). As a result, the capacitor electrode 251 is formed on the first area 40a and the common signal line 301 is formed on the second area 40b.

Thus, in the case of the active matrix substrate 204, the functional fluid 60 is not directly deposited on the second area 40b. This method makes it possible to form a very fine common signal line 301. In other words, this method makes it possible to reduce the area occupied by the common signal line 301 in a circuit corresponding to one pixel of the active matrix substrate 204.

EXAMPLES

Examples of the present invention are described below. It must be noted that the present invention is not limited to the examples described below, and variations and modifications may be made without departing from the scope of the present invention.

[Laminated Structure]

Example 1

In example 1, flow of the functional fluid 60 was observed through the experiments described below.

First, an NMP solution containing a wettability-variable material was applied to a glass substrate by spin-coating. As the wettability-variable material, a polyimide material having an alkyl group in its side chain was used, the surface free energy of which polyimide material changes when irradiated by ultraviolet light. Next, the NMP solution was pre-calcined in an oven at 100° C. and then calcined at 180° C. to remove the solvent and thereby to form the wettability-variable layer 30 (see FIGS. 6A and 6B).

A portion of the wettability-variable layer 30 was exposed to ultraviolet light with a wavelength of 300 nm or smaller (using an ultra-high pressure mercury lamp) through a photomask having a certain pattern to form a corresponding pattern comprising the high-surface-energy area 40 and the low-surface-energy area 50 on the wettability-variable layer 30. The high-surface energy area 40 included the first area 40a and the second area 40b extending from the first area 40a and having a width smaller than that of the first area 40a (see FIGS. 6C and 6D).

Next, the functional fluid 60 containing a conductive material was jetted selectively onto the first area 40a and allowed to flow into the second area 40b so that the entire high-surface-energy area 40 (40a and 40b) was covered by the functional fluid 60 (see FIGS. 6E through 6J). As the functional fluid 60, a nano metal ink containing Ag was used. The surface tension of the functional fluid 60 was about 30 mN/m and the viscosity was about 10 mPa·s. The contact angle of the functional fluid 60 with the high-surface-energy area 40 measured by the sessile drop method was 8° and the contact angle with the low-surface-energy area 50 was 28°. The volume of a drop of the functional fluid 60 jetted from the inkjet head 103 of the inkjet device 100 (see FIG. 7) was 8 pl and its diameter was 25 μm. The mechanical accuracy of positioning by the inkjet device 100 used in this example was about ±15 μm taking into account the deflection of the functional fluid 60 jetted from the inkjet head 103. With the inkjet device 100, when the width of the high-surface-energy area 40 was 60 μm or smaller, it was difficult to jet drops of the functional fluid 60 onto the high-surface-energy area 40 without causing overflow of the functional fluid 60 into other areas. In the examples below, to prevent the overflow of the functional fluid 60 from the high-surface-energy area 40, the width W1 of the first area 40a was set at 80 μm or larger.

Then, the solvent of the functional fluid 60 on the high-surface-energy area 40 (40a and 40b) was evaporated in an oven at 80° C. to form a laminated structure (see FIGS. 6K through 6M).

Figure 13:
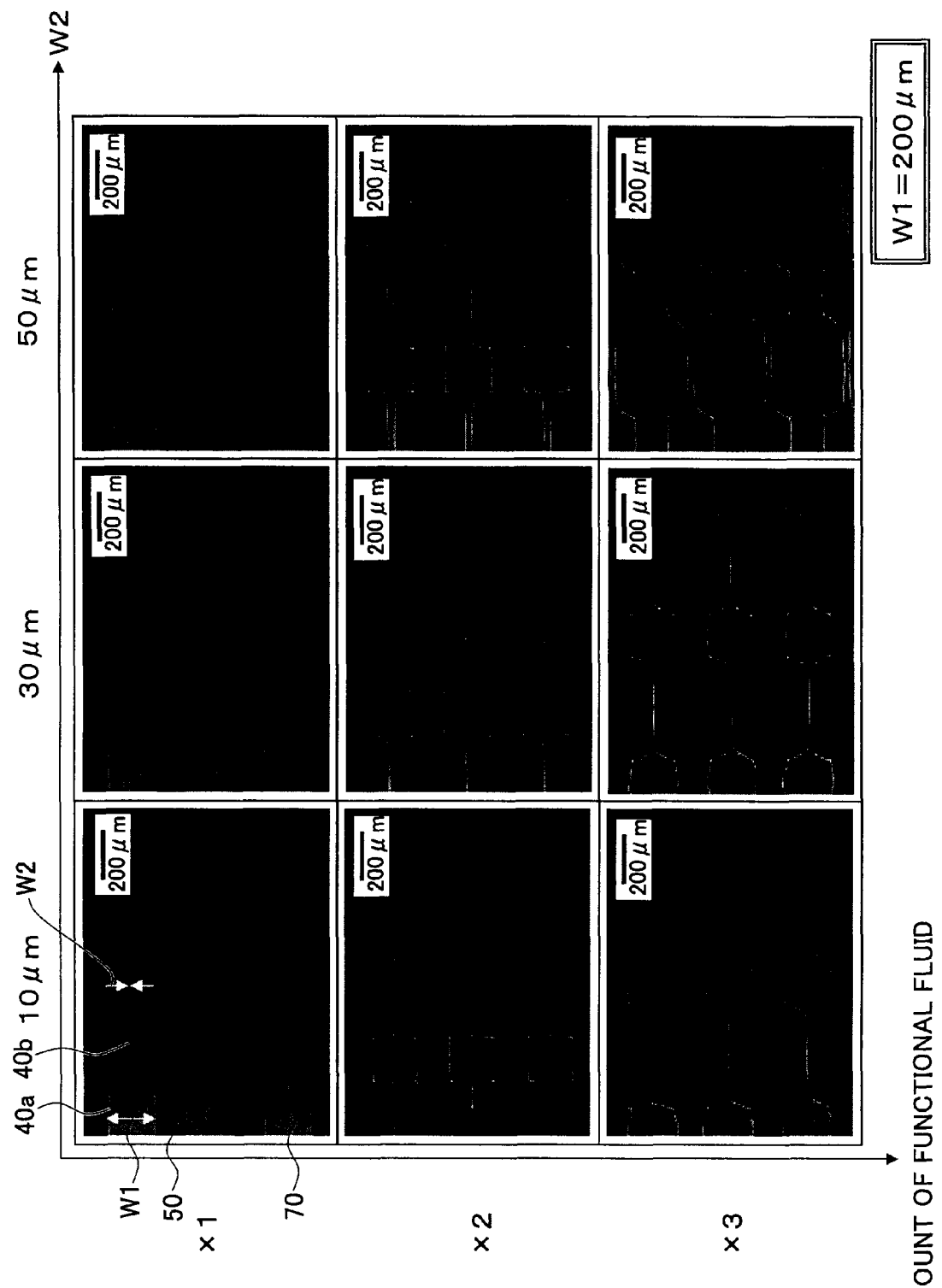
FIG. 13 shows metallurgical micrographs of laminated structures of example 1.

In example 1, the width W1 of the first area 40a was set at 200 μm and the width W2 of the second area 40b was set at 50 μm, 30 μm, or 10 μm. The functional fluid 60 was jetted onto the first area 40a in three different amounts: one-fold, two-fold, and threefold. FIG. 13 shows metallurgical micrographs of laminated structures of example 1.

When the width W2 of the second area 40b was 50 μm, the conductive layer 70 was successfully formed on the second area 40b regardless of the amount of the functional fluid 60. This result shows that using the flow phenomena of the functional fluid 60 makes it possible to form a fine conductive layer 70 which is difficult to form with a conventional method.

When the width W2 of the second area 40b was 30 μm and the amount of the functional fluid 60 was small, breaks were observed in the conductive layer 70 on the second layer 40b. When the width W2 of the second area 40b was 30 μm and the amount of the functional fluid 60 was large, the conductive layer 70 was successfully formed on the second area 40b.

When the width W2 of the second area 40b was 10 μm and the amount of the functional fluid 60 was small, breaks were observed in the conductive layer 70 on the second layer 40b. When the width W2 of the second area 40b was 10 μm and the amount of the functional fluid 60 was large, the functional fluid 60 overflowed into the low-surface-energy area 50 and the conductive layer 70 was not formed correctly on the second layer 40b.

As the results show, to allow the functional fluid 60 to flow smoothly from the first area 40a to the second area 40b and thereby to accurately form a fine conductive layer 70, it is necessary to set the amount of the functional fluid 60 above a certain level and to set the ratio (W1/W2) between the width W1 of the first area 40a and the width W2 of the second area 40b below a certain value.

Example 2

In example 2, the width W1 of the first area 40a and the width W2 of the second area 40b were set as shown in table 1 and wettability-variable layers 30A through 30E having different characteristics were used to observe the flow of the functional fluid 60. Other conditions and the method of experiments in example 2 were substantially the same as those of example 1. Table 1 shows the widths W1 of the first area 40a, the widths W2 of the second area 40b, and corresponding results of the experiments for each of the wettability-variable layers 30A through 30E.

TABLE 1

| Width W1 (μm) of first area 40a | Width W2 (μm) of second area 40b | W1/W2 | Wettability-variable layers 30 | | | | |
|---|---|---|---|---|---|---|---|
| | | | A | B | C | D | E |
| 80 | 50 | 1.6 | ◎ | ◎ | X | ◎ | ◎ |
| 120 | 50 | 2.4 | ◎ | ◎ | X | ◎ | ◎ |
| 80 | 30 | 2.7 | ◎ | ◎ | X | ◎ | ◎ |
| 120 | 30 | 4.0 | ◎ | ○ | X | ◎ | ◎ |
| 200 | 50 | 4.0 | ◎ | ○ | X | ◎ | ◎ |
| 200 | 30 | 6.7 | ◎ | Δ | X | ○ | ◎ |
| 80 | 10 | 8.0 | ◎ | Δ | X | Δ | ◎ |
| 120 | 10 | 12.0 | ○ | Δ | X | Δ | ◎ |
| 200 | 10 | 20.0 | Δ | Δ | X | Δ | ◎ |

◎: The conductive layer 70 was successfully formed on the entire high-surface-energy area 40.
○: Breaks were observed in some cases in the conductive layer 70 on the second area 40b.
Δ: Breaks were observed in almost all cases in the conductive layer 70 on the second area 40b.
X: Breaks were observed in the conductive layer 70 on the first area 40a.

Table 2 below shows the characteristics of the wettability-variable layers 30A through 30E used in example 2. The wettability-variable layers 30A through 30C contain the same wettability-variable material but are exposed to different amounts of ultraviolet light so that their high-surface-energy areas 40 have different contact angles with the functional fluid 60. The wettability-variable layers 30D and 30E contain wettability-variable materials with different side-chain structures and their high-surface-energy areas 40 and low-surface-energy areas 50 have different contact angles with the functional fluid 60.

TABLE 2

| | Contact angle of low-surface-energy area | Contact angle of high-surface-energy area |
|---|---|---|
| A | 28° | 8° |
| B | 28° | 10° |
| C | 28° | 15° |
| D | 23° | 8° |
| E | 33° | 5° |

As shown in tables 1 and 2, with the wettability-variable layer 30C, since its high-surface-energy area 40 has a large contact angle with the functional fluid 60, the functional fluid 60 did not spread uniformly on the high-surface-energy area 40 and breaks were observed in the conductive layer 70 on the first area 40a.

A comparison of the results of the experiments with the wettability-variable layers 30A and 30B shows that when the contact angle of the high-surface-energy area 40 with the functional fluid 60 is small, the conductive layer 70 can be formed successfully on the second area 40b even when the ratio W1/W2 is high. With the wettability-variable layer 30A, it was possible to form a conductive layer 70 having a width of 10 μm that is smaller than the diameter of a drop of the functional fluid 60.

A comparison of the results of the experiments with the wettability-variable layers 30A and 30D shows that when the contact angle of the low-surface-energy area 50 with the functional fluid 60 is high, the conductive layer 70 can be formed successfully on the second area 40b even when the ratio W1/W2 is high. If the contact angle of the low-surface-energy area 50 with the functional fluid 60 is low, the functional fluid 60 tends to overflow from the first area 40a into the low-surface-energy area 50.

Figure 14:
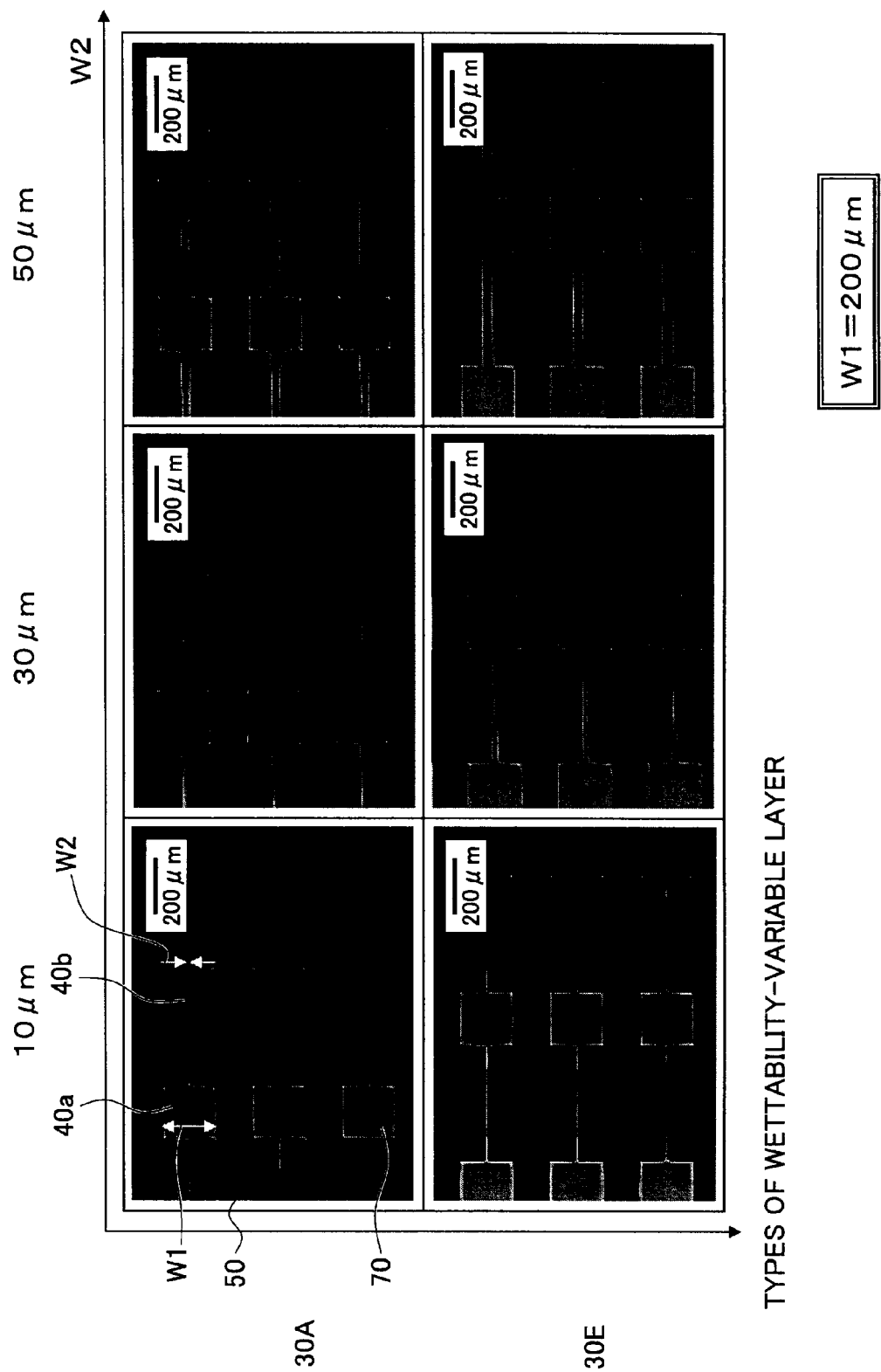
FIG. 14 shows metallurgical micrographs of laminated structures of example 2.

With the wettability-variable layer 30E, it was possible to successfully form the conductive layer 70 on the second area 40b even when the ratio W1/W2 was 20. FIG. 14 shows metallurgical micrographs of laminated structures with the wettability-variable layers 30A and 30E.

As the results show, to allow the functional fluid 60 to flow smoothly from the first area 40a into the second area 40b and thereby to accurately form the conductive layer 70, it is preferable to reduce the contact angle between the high-surface-energy area 40 and the functional fluid 60 and to increase the contact angle between the low-surface-energy area 50 and the functional fluid 60. Contact angles of the high-surface-energy area 40 and the low-surface-energy area 50 with the functional fluid 60 change depending on the solvent of the functional fluid 60, the material of the wettability-variable layer 30, their combinations, and the amount of ultraviolet light applied.

As the results of the example 2 show, embodiments of the present invention make it possible to form a fine conductive layer 70 having a width as small as 10 μm using a normal inkjet device that jets functional liquid drops having a volume as large as 8 pl. Formation of such a fine conductive layer is not possible with a conventional inkjet method.

[Multilayer Circuit Board]

Example 3

In example 3, a multilayer circuit board was prepared by forming a source electrode 232 and a source signal line 292 using the conductive layer 70 described above.

FIG. 15A shows a top view of a multilayer circuit board of comparative example 1, FIG. 15B shows a top view of a multilayer circuit board of example 3, and FIG. 15C is a cross-sectional view taken along line A-A of the multilayer circuit board shown in FIG. 15A or 15B. On each of the multilayer circuit boards, a drain electrode 242 was formed in addition to the source electrode 232 and the source signal line 292.

For descriptive purposes, FIGS. 15A and 15B each shows only a portion of a multilayer circuit board which portion corresponds to one pixel. It is assumed that 1000 pixels are arranged in a line on each of the multilayer circuit boards of comparative example 1 and example 3. The size of each pixel is 317.5 μm that corresponds to 80 ppi. The wettability-variable material (polyimide material), the functional fluid 60, the method of exposing a wettability-variable layer to ultraviolet light, and the method of applying the functional fluid 60 used in comparative example 1 and example 3 were substantially the same as those used in example 1 and detailed descriptions of them are omitted here.

In both comparative example 1 and example 3, an NMP solution containing a polyimide material was applied to a film substrate 21 by spin-coating. The NMP solution was pre-calcined in an oven at 100° C. and then calcined at 180° C. to remove the solvent and thereby to form a wettability-variable layer 31. A portion of the wettability-variable layer 31 was exposed to ultraviolet light through a photomask having a certain pattern to form a corresponding pattern comprising a high-surface-energy area 41 and a low-surface-energy area 51 on the wettability-variable layer 31.

Next, drops of the functional fluid 60 were jetted onto the high-surface-energy area 41 and heat-treated to form a gate electrode 212 having a width of 80 μm.

Then, an NMP solution containing a polyimide material was applied onto the wettability-variable layer 31 and the gate electrode 212 by spin-coating. The NMP solution was pre-calcined in an oven at 100° C. and then calcined at 180° C. to remove the solvent and thereby to form a wettability-variable layer (gate insulating layer) 32. A portion of the wettability-variable layer 32 was exposed to ultraviolet light through a photomask having a certain pattern to form a corresponding pattern comprising a high-surface-energy area 42 and a low-surface-energy area 52 on the wettability-variable layer 32. The high-surface energy area 42 includes a first area 42a and a second area 42b extending from the first area 42a.

In example 3, after the above steps, drops of the functional fluid 60 were selectively jetted onto positions D8 in the first area 42a and allowed to flow into the second area 42b so that the entire high-surface-energy area 42 (42a and 42b) was covered by the functional fluid 60. The functional fluid 60 was then heat-treated to form the source electrode 232 and the source signal line 292.

In comparative example 1, after the above steps, drops of the functional fluid 60 were jetted onto positions D9 throughout the high-surface-energy area 42 (42a and 42b) to form the source electrode 232 and the source signal line 292.

Table 3 shows the widths W1 of the first area 42a, the widths W2 of the second area 42b, gaps L1 between the source electrode 232 and the drain electrode 242, gaps L2 between the source signal line 292 and the drain electrode 242, and corresponding evaluation results of the multilayer circuit boards of example 3 and comparative example 1.

TABLE 3

| W1 (μm) | W2 (μm) | L1 (μm) | L2 (μm) | Example 3 | | Comparative example 1 | |
|---|---|---|---|---|---|---|---|
| | | | | Electric characteristics | Result of microscopic observation | Electric characteristics | Result of microscopic observation |
| 80 | 80 | 20 | 40 | ○ | ○ | ○ | ○ |
| 80 | 80 | 10 | 40 | ○ | ○ | ○ | ○ |
| 80 | 80 | 5 | 40 | ○ | ○ | X | Δ |
| 80 | 40 | 20 | 40 | ○ | ○ | X | X |
| 80 | 40 | 10 | 40 | ○ | ○ | X | X |
| 80 | 40 | 5 | 40 | ○ | ○ | X | X |

TABLE 3-continued

| | | | | Example 3 | | Comparative example 1 | |
|---|---|---|---|---|---|---|---|
| W1 (μm) | W2 (μm) | L1 (μm) | L2 (μm) | Electric characteristics | Result of microscopic observation | Electric characteristics | Result of microscopic observation |
| 80 | 20 | 20 | 40 | ○ | ○ | X | X |
| 80 | 20 | 10 | 40 | ○ | ○ | X | X |
| 80 | 20 | 5 | 40 | ○ | ○ | X | X |

Evaluations of the multilayer circuit boards were performed by applying a voltage between 1000 pairs of the source electrode 232 and the drain electrode 242 that are electrically connected and determining short circuits between them based on the value of a current flowing through the circuit. When a short circuit was detected based on the current value, the presence of the short circuit was confirmed by metallurgical microscopic observation.

As evident from the results shown in table 3, in the case of comparative example 1, the width W2 of the second area 42b must be 80 μm or larger and the gap L1 between the source electrode 232 and the drain electrode 242 must be 10 μm or larger to prevent short circuits.

In the case of example 3, the width W2 of the second area 42b can be made as small as 20 μm and the gap L1 between the source electrode 232 and the drain electrode 242 can be made as small as 5 μm.

According to the method used in example 3, the functional fluid 60 is not jetted directly onto the second area 42b. As the results show, this method makes it possible to form a very fine source electrode 232 and to reduce short circuits between the source electrode 232 and the drain electrode 242.

[Active Matrix Substrate and Electronic Display]

Example 4

In example 4, an active matrix substrate was produced by applying a toluene solution containing an organic semiconductor material to a multilayer circuit board of example 3 (see FIG. 15B) and thereby forming a semiconductor layer on the multilayer circuit board. As the organic semiconductor material, a polymer synthesized according to the schema shown by the chemical formula below was used.

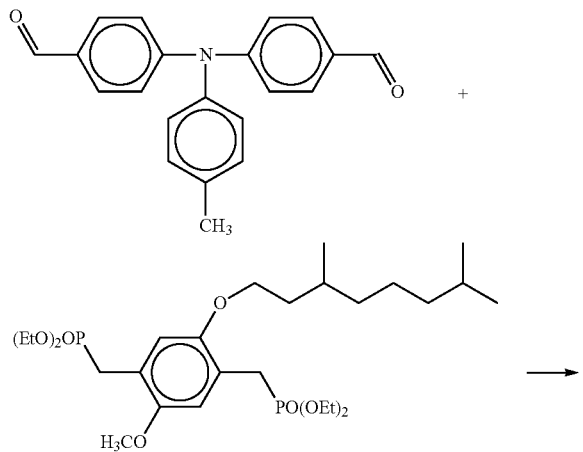

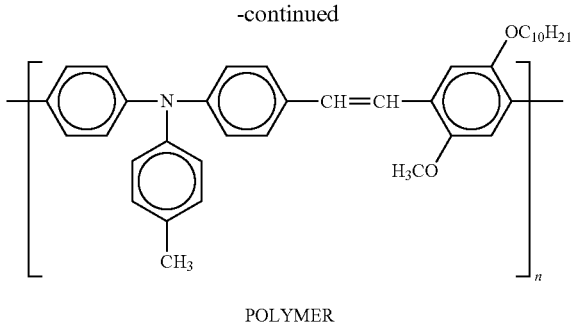

POLYMER

Also in example 4, an electronic display was produced by laminating an electrophoresis device onto the active matrix substrate. The electrophoresis device was produced by applying a PVA aqueous solution containing microcapsules to a polycarbonate substrate having transparent electrodes made of indium tin oxide (ITO) and thereby forming a layer containing the microcapsules and a PVA binder on the polycarbonate substrate. The microcapsules contain Isopar™ colored by titanium oxide oil blue. The produced electronic display was able to display an image with high contrast.

The present invention is not limited to the specifically disclosed embodiments, and variations and modifications may be made without departing from the scope of the present invention.

The present application is based on Japanese Priority Application No. 2006-213404 filed on Aug. 4, 2006 and Japanese Priority Application No. 2007-182448, filed on Jul. 11, 2007, the entire contents of which are hereby incorporated herein by reference.

What is claimed is:

1. A method of forming a laminated structure, comprising:
forming a wettability-variable layer containing a wettability-variable material whose surface energy changes when energy is applied thereto;
forming a high-surface-energy area having high surface energy and a low-surface-energy area having low surface energy on the wettability-variable layer by applying energy to a portion of the wettability-variable layer, the high-surface-energy area including a first area having a width W1 and a second area extending from the first area and having a width W2 that is smaller than the width W1 of the first area;
depositing a functional fluid containing a functional material selectively on the first area without filling the second area with the functional fluid and allowing a portion of the deposited functional fluid to flow into the second area so that the functional fluid covers the high-surface-energy area including the first area and the second area; and forming a functional layer containing the functional material on the high-surface-energy area by evaporating the functional fluid on the high-surface-energy area,
wherein a contact angle of the functional fluid with the high-surface-energy area is 8 degrees or smaller and a contact angle of the functional fluid with the low-surface-energy area, if the functional fluid is on the low-surface-energy area, is 28 degrees or larger.

2. A method according to claim 1, wherein said depositing of the functional fluid comprises:
depositing the functional fluid using an inkjet method.

3. A method according to claim 1, wherein:
the high-surface-energy area is formed to include a plurality of the second areas extending from the first area.

4. A method according to claim 1, wherein:
the high-surface-energy area is formed to include a tapered connecting area between the first area and the second area.

5. A method according to claim 1, wherein:
the high-surface-energy area is formed to include a third area extending from the second area and having a width smaller than that of the second area.

6. A method according to claim 1, wherein:
the high-surface-energy area further includes a third area extending from the second area and having a width larger than that of the second area.

7. A method according to claim 1, wherein:
the radius of curvature of the functional fluid on the first area is smaller than the radius of curvature of the functional fluid on the second area.

8. A method of forming a laminated structure, comprising:
forming a wettability-variable layer containing a wettability-variable material whose surface energy changes when energy is applied thereto;
forming a high-surface-energy area having high surface energy and a low-surface-energy area having low surface energy on the wettability-variable layer by applying energy to a portion of the wettability-variable layer, the high-surface-energy area including a first area having a width W1 and a second area extending from the first area and having a width W2 that is smaller than the width W1 of the first area;
depositing a functional fluid containing a functional material selectively on the first area without filling the second area with functional fluid and allowing a portion of the deposited functional fluid to flow into the second area so that the functional fluid covers the high-surface-energy area including the first area and the second area; and
forming a functional layer containing the functional material on the high-surface-energy area by evaporating the functional fluid on the high-surface-energy area,
wherein a contact angle of the functional fluid with the high-surface-energy area is 8 degrees or smaller and a contact angle of the functional fluid with the low-surface-energy area, if the functional fluid is on the low-surface-energy area, is 28 degrees or larger, and
wherein $1.6 \leq W1/W2 \leq 12$.

9. A method according to claim 8, wherein said depositing of the functional fluid comprises:
depositing the functional fluid using an inkjet method.

10. A method according to claim 8, wherein:
the high-surface-energy area is formed to include a plurality of the second areas extending from the first area.

11. A method according to claim 8, wherein:
the high-surface-energy area is formed to include a tapered connecting area between the first area and the second area.

12. A method according to claim 8, wherein:
the high-surface-energy area is formed to include a third area extending from the second area and having a width smaller than that of the second area.

13. A method according to claim 8, wherein:
the high-surface-energy area further includes a third area extending from the second area and having a width larger than that of the second area.

14. A method according to claim 8, wherein:
the radius of curvature of the functional fluid on the first area is smaller than the radius of curvature of the functional fluid on the second area.

15. A method according to claim 8, wherein:
$1.6 \leq W1/W2 \leq 8$.

\* \* \* \* \*